US 11,350,549 B2

(12) United States Patent
Suzuki et al.

(10) Patent No.: US 11,350,549 B2
(45) Date of Patent: May 31, 2022

(54) COMPONENT SUPPLY DEVICE AND COMPONENT MOUNTING DEVICE

(71) Applicant: YAMAHA HATSUDOKI KABUSHIKI KAISHA, Iwata (JP)

(72) Inventors: Norimitsu Suzuki, Iwata (JP); Takafumi Fukuda, Iwata (JP); Tomoyasu Arai, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 125 days.

(21) Appl. No.: 17/045,121

(22) PCT Filed: Apr. 12, 2018

(86) PCT No.: PCT/JP2018/015369
§ 371 (c)(1),
(2) Date: Oct. 2, 2020

(87) PCT Pub. No.: WO2019/198195
PCT Pub. Date: Oct. 17, 2019

(65) Prior Publication Data
US 2021/0153398 A1 May 20, 2021

(51) Int. Cl.
*H05K 13/02* (2006.01)
*H05K 13/04* (2006.01)
*H05K 13/00* (2006.01)

(52) U.S. Cl.
CPC ....... *H05K 13/021* (2013.01); *H05K 13/0084* (2013.01); *H05K 13/0419* (2018.08); *Y10T 29/53174* (2015.01)

(58) Field of Classification Search
CPC .. H05K 13/0084; H05K 13/02; H05K 13/021; H05K 13/0419; H05K 13/043;
(Continued)

(56) References Cited

U.S. PATENT DOCUMENTS

| 5,645,392 A * | 7/1997 | Leichty ............... B65G 59/063 |
| | | 414/416.01 |
| 5,868,545 A * | 2/1999 | Kasai .................... B65G 65/00 |
| | | 414/331.15 |
| 2005/0276170 A1 | 12/2005 | Petrus Maria Vermeer et al. |

FOREIGN PATENT DOCUMENTS

| CN | 105283061 A | 1/2016 |
| CN | 106378721 A | 2/2017 |

(Continued)

OTHER PUBLICATIONS

An Office Action mailed by China National Intellectual Property Administration dated Nov. 12, 2021, which corresponds to Chinese Patent Application No. 201880091519.1 and is related to U.S. Appl. No. 17/045,121; with English language translation.

(Continued)

*Primary Examiner* — Peter Dungba Vo
*Assistant Examiner* — Joshua D Anderson
(74) *Attorney, Agent, or Firm* — Studebaker & Brackett PC

(57) ABSTRACT

A component supply device includes a pallet configured to allow a tray to be arranged thereon, a magazine operable to hold a plurality of pallets, and a magazine holder configured to allow the magazine to be arranged therein. The magazine holder is configured to allow the pallet to be conveyed from the magazine that has been arranged to a component supply position. The component supply device further includes a magazine supply unit configured to supply the magazine to the magazine holder, a magazine ejection unit configured to receive the magazine ejected from the magazine holder, and a magazine conveyance unit configured to convey the magazine from the magazine supply unit to the magazine holder.

20 Claims, 12 Drawing Sheets

(58) Field of Classification Search
CPC .............. H05K 13/0434; H05K 13/086; Y10T 29/4913; Y10T 29/53174; Y10T 29/53178; Y10T 29/53261
See application file for complete search history.

(56) References Cited

FOREIGN PATENT DOCUMENTS

| | | | |
|---|---|---|---|
| CN | 106612612 A | 5/2017 | |
| CN | 107079613 A | 8/2017 | |
| JP | H05-008130 A | 1/1993 | |
| JP | H06-156562 A | 6/1994 | |
| JP | H09-214178 A | 8/1997 | |
| JP | H11-163592 A | 6/1999 | |
| JP | 2000-156593 A | 6/2000 | |
| JP | 2004-104147 A | 4/2004 | |
| JP | 4368612 B2 | 11/2009 | |
| JP | 2011-228327 A | 11/2011 | |
| JP | 5548947 B2 | 7/2014 | |
| JP | 5850661 B2 | 2/2016 | |
| KR | 20150017487 A | 2/2015 | |

OTHER PUBLICATIONS

An Office Action mailed by China National Intellectual Property Administration dated Mar. 26, 2021, which corresponds o Chinese Patent Application No. 201880091519.1 and is related to U.S. Appl. No. 17/045,121 with English language translation.

International Search Report issued in PCT/JP2018/015369; dated Jul. 3, 2018.

Written Opinion issued in PCT/JP2018/015369; dated Jul. 3, 2018.

An Office Action; "Notice of Reasons for Refusal", mailed by the Japanese Patent Office dated Jun. 22, 2021, which corresponds to Japanese Patent Application No. 2020-513011 and is related to U.S. Appl. No. 17/045,121; with English language translation.

* cited by examiner

COMPONENT SUPPLY DEVICE AND COMPONENT MOUNTING DEVICE

CROSS-REFERENCE TO RELATED APPLICATION

This application is a National Stage of International Patent Application No. PCT/JP2018/015369, filed Apr. 12, 2018, the entire content of which is incorporated herein by reference.

BACKGROUND

Technical Field

The present disclosure relates to a component supply device and a component mounting device.

Background Art

Conventionally, a component supply device is known. A component supply device is disclosed in Japanese Patent No. 4368612, for example.

Japanese Patent No. 4368612 discloses a component supply device including tray plates on which trays, on which components have been placed, are arranged, a tray magazine capable of holding a plurality of tray plates, and a tray plate placement portion on which a tray plate that has run out of components is placed. In this component supply device, tray plates that have run out of components are pulled out one by one of the tray magazine and are placed on the tray plate placement portion, and an operator replenishes the trays with components at the tray plate placement portion.

SUMMARY

In the component supply device disclosed in Japanese Patent No. 4368612, the tray plates that have run out of components are pulled out one by one of the tray magazine and are placed on the tray plate placement portion, and at the tray plate placement portion, the operator replenishes the trays with components. Therefore, the operator needs to perform a replenishment operation each time the tray plate runs out of components. Furthermore, when all the components of the trays of the tray magazine are run out, it is necessary to interrupt the component mounting operation until the operator completes component replenishment, and thus the component mounting operation may be disadvantageously interrupted for a long time. Therefore, there are problems that the work burden on the operator performing a component replenishment operation is increased, and it is difficult to significantly reduce or prevent prolonged interruption of the component mounting operation.

Therefore, the present disclosure provides a component supply device and a component mounting device, both of which are capable of significantly reducing or preventing an increase in the work burden on an operator performing a component replenishment operation and significantly reducing or preventing prolonged interruption of the component mounting operation.

A component supply device according to a first aspect of the present disclosure is configured to supply a component to a component mounting device configured to mount the component on a substrate, and includes a pallet configured to allow a tray, on which the component is placed, to be arranged thereon, a magazine operable to hold a plurality of pallets, and a magazine holder configured to allow the magazine to be arranged therein. The magazine holder is configured to allow the pallet to be conveyed from the magazine that has been arranged to a component supply position. The component supply device further includes a magazine supply unit configured to supply the magazine to the magazine holder, a magazine ejection unit configured to receive the magazine ejected from the magazine holder, and a magazine conveyance unit configured to convey the magazine from the magazine supply unit to the magazine holder.

The aforementioned component supply device according to the first aspect of the present disclosure is configured as described above such that the magazine conveyance unit can convey the magazine that holds the plurality of pallets from the magazine supply unit to the magazine holder at which the pallets on which the trays have been arranged can be supplied, and thus it is possible to automatically make replenishment of the components placed on the trays. Consequently, the operator's operation is not required when replenishment of the components is made by the magazine, and thus it is possible to significantly reduce or prevent an increase in the work burden on the operator performing a component replenishment operation. In addition, it is possible to reduce the waiting time for the operator to make replenishment of the components. Thus, it is possible to significantly reduce or prevent prolonged interruption of the component mounting operation. Furthermore, the time required for component replenishment can be reduced as compared with a case in which the operator performs an operation on the pallets one by one.

In the aforementioned component supply device according to the first aspect of the present disclosure, the magazine conveyance unit is preferably configured to convey the magazine from the magazine supply unit to the magazine holder based on the magazine, which has been arranged in the magazine holder, becoming replaceable. Accordingly, when the magazine of the magazine holder has become replaceable, the magazine is automatically supplied by the magazine conveyance unit, and thus the operator does not need to replace the magazine. Thus, it is possible to effectively significantly reduce or prevent an increase in the work burden on the operator performing a component replenishment operation.

In the aforementioned component supply device according to the first aspect, the magazine is preferably configured to be moved from the magazine supply unit to the magazine holder along a substantially horizontal direction. Accordingly, the magazine that holds a plurality of trays on which the unmounted components have been arranged can be placed in the magazine holder by moving in the substantially horizontal direction, and thus unlike a case in which the magazine moves in an upward-downward direction, it is possible to significantly reduce or prevent movement of the components due to vibrations or the like during movement of the magazine. Consequently, it is possible to significantly reduce or prevent movement and a change in the orientations of the components arranged on the trays.

In the aforementioned component supply device according to the first aspect, the magazine supply unit, the magazine holder, and the magazine ejection unit are preferably arranged along a direction parallel to a conveyance direction of the substrate of the component mounting device. Accordingly, the magazine supply unit and the magazine ejection unit can be arranged without interfering with another device connected in the conveyance direction of the substrate of the component mounting device.

In the aforementioned component supply device according to the first aspect, the magazine ejection unit preferably includes a slope formed at a boundary with the magazine holder, and the magazine is preferably configured to be moved from the magazine holder to the magazine ejection unit down the slope. Accordingly, it is not necessary to provide a conveyance unit in the magazine ejection unit, and thus the device structure can be simplified.

In the aforementioned component supply device according to the first aspect, the magazine supply unit and the magazine ejection unit are preferably arranged at positions lower than an installation height of a tape feeder, which is configured to supply a component held on a tape to the component mounting device, of the component mounting device. Accordingly, the magazine supply unit and the magazine ejection unit are arranged in a space below the tape feeder such that the space can be effectively utilized. Furthermore, when the operator accesses the tape feeder, interference of the magazine supply unit and the magazine ejection unit can be significantly reduced or prevented.

In the aforementioned component supply device according to the first aspect, the magazine supply unit and the magazine ejection unit are preferably configured to be attachable to and detachable from a device main body with the magazine holder being arranged therein. Accordingly, the magazine supply unit and the magazine ejection unit can be removed from the device main body and be moved, and thus the operator can easily access the component mounting device. Consequently, maintenance of the component mounting device can be easily performed.

In this case, the magazine conveyance unit preferably includes a first conveyance unit provided in the magazine supply unit, a second conveyance unit provided in the magazine holder, and a transmission mechanism configured to transmit a driving force of one of the first conveyance unit and the second conveyance unit to the other of the first conveyance unit and the second conveyance unit, and the first conveyance unit and the second conveyance unit are preferably configured to be driven by a common drive. Accordingly, as compared with a case in which a drive is provided in each of the first conveyance unit and the second conveyance unit, the number of components can be reduced, and the device structure of the magazine conveyance unit can be simplified.

In the aforementioned structure including the magazine conveyance unit including the first conveyance unit and the second conveyance unit, the magazine conveyance unit preferably further includes a third conveyance unit provided in the magazine ejection unit, and the first conveyance unit, the second conveyance unit, and the third conveyance unit are preferably configured to be driven by the common drive. Accordingly, as compared with a case in which a drive is provided in each of the first conveyance unit, the second conveyance unit, and the third conveyance unit, the number of components can be reduced, and the device structure of the magazine conveyance unit can be further simplified.

In the aforementioned component supply device according to the first aspect, the magazine supply unit and the magazine ejection unit are preferably configured to be foldable with respect to a device main body with the magazine holder being arranged therein. Accordingly, the magazine supply unit and the magazine ejection unit are folded such that it is possible to ensure a maintenance space for the component supply device and the component mounting device, and thus maintainability can be improved.

The aforementioned component supply device according to the first aspect preferably further includes a magazine circulation unit configured to receive the magazine from the magazine ejection unit and move the magazine to the magazine supply unit. Accordingly, replenishment of the components is made in the magazine circulation unit such that the magazine of the magazine ejection unit can be returned to the magazine supply unit, and thus it is not necessary to convey the magazine to the magazine supply unit or take out the magazine from the magazine ejection unit. Thus, the work burden on the operator can be further reduced.

The aforementioned component supply device according to the first aspect preferably further includes a self-propelled trolley that is self-propellable, the self-propelled trolley being configured to convey the magazine to the magazine supply unit and convey the magazine from the magazine ejection unit. Accordingly, the operator does not need to convey the magazine to the magazine supply unit or convey the magazine from the magazine ejection unit, and thus the work burden on the operator can be further reduced.

In the aforementioned component supply device according to the first aspect, the magazine is preferably suspended and carried in the magazine supply unit, and the magazine is preferably suspended and carried out of the magazine ejection unit. Accordingly, the conveyance mechanism that suspends and conveys the magazine is provided in a space above the component mounting device and the component supply device, and thus effectively utilizing the upper space, the magazine can be conveyed.

The aforementioned component supply device according to the first aspect preferably further includes a shutter provided on each of a magazine supply unit side and a magazine ejection unit side of the magazine holder, the shutter being configured to be openable and closable. Accordingly, the shutter can be closed except when the magazine is conveyed, and thus it is possible to significantly reduce or prevent entry of foreign matter into the magazine holder.

A component mounting device according to a second aspect of the present disclosure includes a mounting head configured to mount a component on a substrate, and a component supply unit configured to supply the component to the mounting head. The component supply unit includes a pallet configured to allow a tray, on which the component is placed, to be arranged thereon, a magazine operable to hold a plurality of pallets, a magazine holder configured to allow the magazine to be arranged therein, the magazine holder being configured to allow the pallet to be conveyed from the magazine that has been arranged to a component supply position, a magazine supply unit configured to supply the magazine to the magazine holder, a magazine ejection unit configured to receive the magazine ejected from the magazine holder, and a magazine conveyance unit configured to convey the magazine from the magazine supply unit to the magazine holder.

The component mounting device according to the second aspect of the present disclosure is configured as described above such that the magazine conveyance unit can convey the magazine that holds the plurality of pallets from the magazine supply unit to the magazine holder at which the pallets on which the trays have been arranged can be supplied, and thus it is possible to automatically make replenishment of the components placed on the trays. Consequently, the operator's operation is not required when replenishment of the components is made by the magazine, and thus it is possible to significantly reduce or prevent an increase in the work burden on the operator performing a component replenishment operation. In addition, it is possible to reduce the waiting time for the operator to make replenishment of the components. Thus, it is possible to significantly reduce or prevent prolonged interruption of the component mounting operation. Furthermore, the time required for component replenishment can be reduced as compared with a case in which the operator performs an operation on the pallets one by one.

According to the present disclosure, as described above, it is possible to significantly reduce or prevent an increase in the work burden on the operator performing the component replenishment operation and significantly reduce or prevent prolonged interruption of the component mounting operation.

DETAILED DESCRIPTION

Embodiments embodying the present disclosure are hereinafter described on the basis of the drawings.

Frist Embodiment

The structure of a component mounting device 100 and component supply devices 10 according to a first embodiment of the present disclosure is described with reference to FIGS. 1 to 3.

(Structure of Component Mounting Device)

The structure of the component mounting device 100 according to the first embodiment of the present disclosure is now described with reference to FIG. 1.

Figure 1:
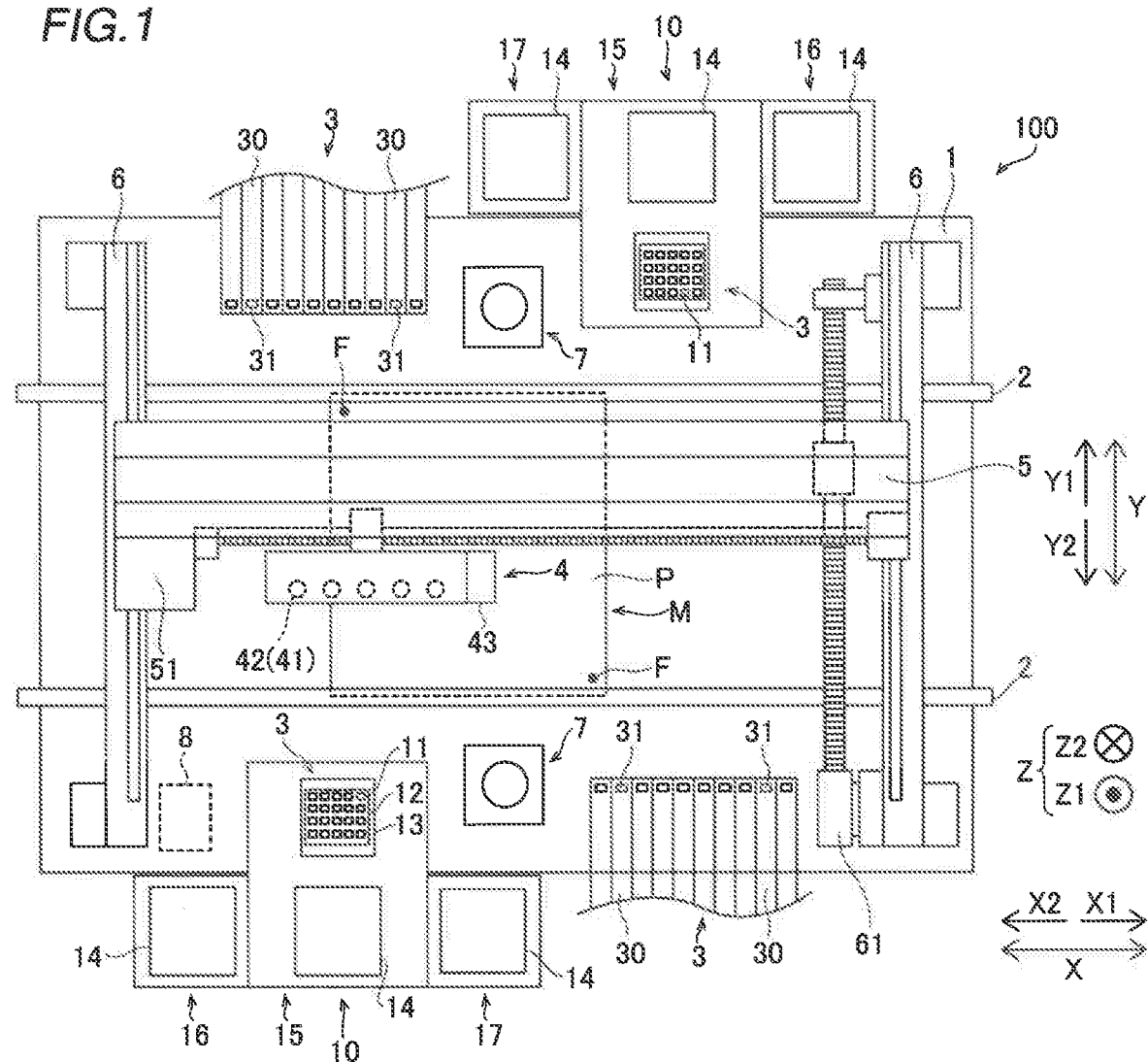
FIG. 1 is diagram showing the overall structure of a component mounting device according to a first embodiment of the present disclosure.

As shown in FIG. 1, the component mounting device 100 is a component mounting device configured to convey a substrate P in an X direction by a pair of conveyors 2 and to mount components 11 and 31 on the substrate P at a mounting operation position M.

The component mounting device 100 includes a base 1, the pair of conveyors 2, component feeders 3, a head unit 4, a support 5, a pair of rails 6, component recognition imagers 7, and a controller 8.

The pair of conveyors 2 are installed on the base 1 and are configured to convey the substrate P in the X direction. In addition, the pair of conveyors 2 include a holding mechanism that holds the substrate P being conveyed in a stopped state at the mounting operation position M. Moreover, an interval between the pair of conveyors 2 in a Y direction can be adjusted according to the dimensions of the substrate P.

The component feeders 3 are arranged outside (Y1 and Y2 sides) of the pair of conveyors 2. A plurality of component supply devices 10 and a plurality of tape feeders 30 are arranged in the component feeders 3. The component supply devices 10 of the component feeders 3 are configured to feed the components 11 to mounting heads 42 described below. The tape feeders 30 of the component feeders 3 are configured to supply the components 31 to the mounting heads 42. The component supply devices 10 are examples of a "component supply unit" in the claims.

Each of the component supply devices 10 is configured to supply the components 11 from a tray 12 on which a plurality of components 11 are placed. Specifically, each of the component supply devices 10 is configured to supply the components 11 from the tray 12 arranged at a component supply position. The tray 12 is arranged on a pallet 13, and is supplied. The pallet 13 on which the tray 12 is arranged is housed and held in a magazine 14. Furthermore, when the components 11 are run out, the pallet 13 (tray 12) at the component supply position is replaced with the pallet 13

(tray 12) in the magazine 14. The tray 12 is divided into installation regions for the components 11. The components 11 are placed side by side on the tray 12 in a flat manner. The components 11 include package components such as quad flat packages (QFP) and ball grid arrays (BGA). A detailed description of the component supply devices 10 is given below.

The tape feeders 30 hold reels on which tapes that hold a plurality of components 31 at a predetermined interval are wound. The tape feeders 30 are configured to supply the components 31 from the tips of the tape feeders 30 in the Y direction by rotating the reels to feed the tapes that hold the components 31. The tape feeders 30 supply the components 31 that are relatively smaller than the components 11 of the component supply devices 10. The components 31 include electronic components such as ICs, transistors, capacitors, and resistors.

The head unit 4 is arranged above the pair of conveyors 2 and the component feeders 3, and includes a plurality of (five) mounting heads 42 including nozzles 41 attached to their lower ends and a substrate recognition camera 43.

The mounting heads 42 are configured to mount the components 11 supplied from the component supply devices 10 on the substrate P. The mounting heads 42 are also configured to mount the components 31 supplied from the tape feeders 30 on the substrate P. Specifically, the mounting heads 42 are configured to suction the components 11 supplied by the component supply devices 10 and the components 31 supplied by the component feeders 3 and to mount the suctioned components 11 (components 31) on the substrate P arranged at the mounting operation position M. The mounting heads 42 are movable up and down (movable in a Z direction). Furthermore, the mounting heads 42 are configured to suction and hold the components 11 (components 31) supplied from the component supply devices 10 by a negative pressure generated at the tips of the nozzles 41 by a negative pressure generator (not shown) and to mount the components 11 (components 31) at mounting positions on the substrate P.

The substrate recognition camera 43 is configured to image fiducial marks F of the substrate P in order to recognize the position and the orientation of the substrate P. The positions of the fiducial marks F are imaged and recognized such that the mounting positions of the components 11 (components 31) on the substrate P can be accurately acquired.

The support 5 includes a motor 51. The support 5 is configured to move the head unit 4 in the X direction along the support 5 by driving the motor 51. Opposite ends of the support 5 are supported by the pair of rails 6.

The pair of rails 6 are fixed on the base 1. A rail 6 on the X1 side includes a motor 61. The rails 6 are configured to move the support 5 in the Y direction orthogonal to the X direction along the pair of rails 6 by driving the motor 61. The head unit 4 is movable in the X direction along the support 5, and the support 5 is movable in the Y direction along the rails 6 such that the head unit 4 is movable in a horizontal direction (the X and Y directions).

The component recognition imagers 7 are fixed on the upper surface of the base 1. The component recognition imagers 7 are arranged outside (Y1 and Y2 sides) of the pair of conveyors 2. The component recognition imagers 7 are configured to image the components 11 (components 31) suctioned by the nozzles 41 of the mounting heads 42 from below (Z2 side) in order to recognize the suction states (suction orientations) of the components 11 (components 31) prior to mounting of the components 11 (components 31).

Thus, the suction states of the components 11 (components 31) suctioned by the nozzles 41 of the mounting heads 42 can be acquired by the controller 8.

The controller 8 includes a CPU and a memory, and is configured to control the overall operation of the component mounting device 100 such as the substrate P conveying operation performed by the pair of conveyors 2, the mounting operation performed by the head unit 4, and the imaging operations performed by the component recognition imagers 7 and the substrate recognition camera 43. Moreover, the controller 8 is configured or programmed to control the mounting operation in cooperation with a controller of each of the plurality of component supply devices 10.

(Structure of Component Supply Device)

The structure of each of the component supply devices 10 according to the first embodiment of the present disclosure is now described with reference to FIGS. 2 and 3.

Figure 2:
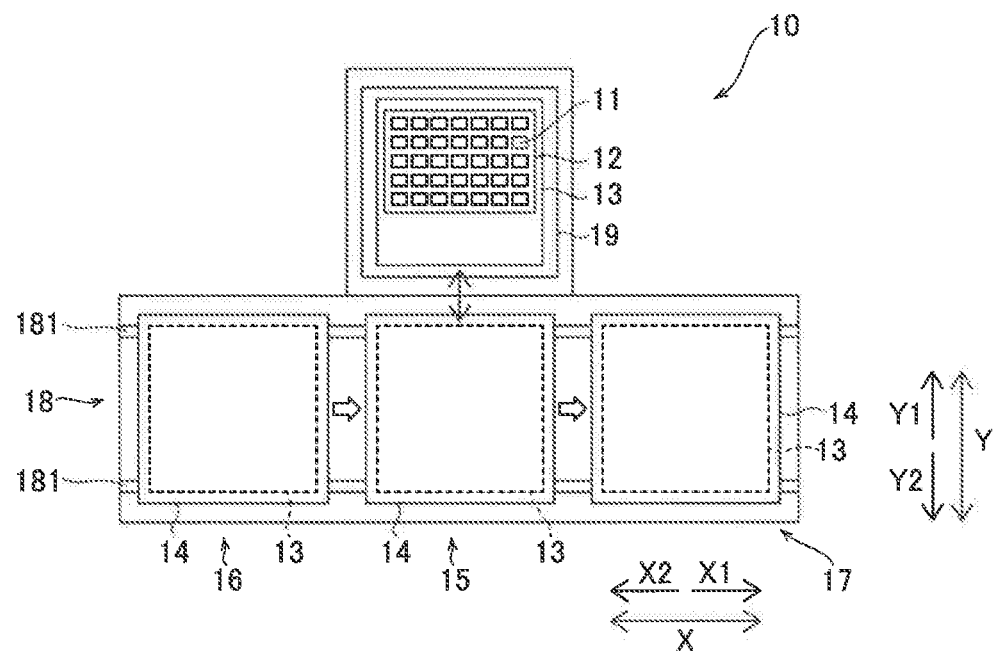
FIG. 2 is a plan view showing a component supply device according to the first embodiment of the present disclosure.

As shown in FIG. 2, each of the component supply devices 10 is configured to supply the components 11 to the mounting heads 42 of the component mounting device 100 that mounts the components 11 on the substrate P. The component supply devices 10 each includes pallets 13, magazines 14, a magazine holder 15, a magazine supply unit 16, a magazine ejection unit 17, a magazine conveyance unit 18, and a pallet conveyance unit 19. An example of FIG. 2 shows the component supply device 10 arranged on the Y2 direction side of the component mounting device 100.

On each of the pallets 13, the tray 12 on which the components are placed is arranged. One or a plurality of trays 12 are arranged on the pallet 13. The tray 12 arranged on the pallet 13 is positioned on the pallet 13 by a positioning member including a magnet. The pallet 13 is made of a magnetic material. Accordingly, the positioning member including the magnet can be easily fixed to the pallet 13.

Figure 3:
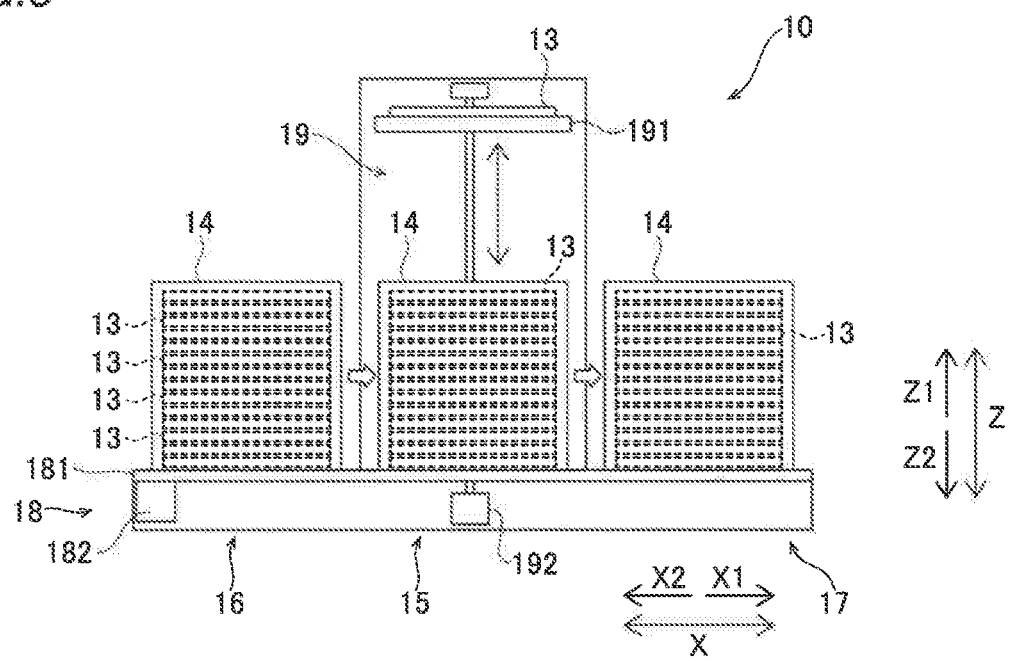
FIG. 3 is a front view showing the component supply device according to the first embodiment of the present disclosure.

As shown in FIG. 3, each of the magazines 14 can hold a plurality of pallets 13. Specifically, the magazine 14 is configured to hold a plurality of pallets 13 arranged in an upward-downward direction. Furthermore, each of the pallets 13 can be put in and taken out from the magazine 14.

The magazine 14 is arranged in the magazine holder 15. The pallet 13 (tray 12) is supplied to the component supply position from the magazine 14 set in the magazine holder 15.

The magazine supply unit 16 is configured to supply the magazine 14 to the magazine holder 15. That is, the magazine supply unit 16 is configured to supply the plurality of components 11 together with the magazine 14 to the magazine holder 15. The magazine 14 is supplied to the magazine supply unit 16 by an operator.

The magazine ejection unit 17 is configured to receive the magazine 14 ejected from the magazine holder 15. That is, the magazine ejection unit 17 is configured to receive the used magazine 14 and temporarily store it. The magazine 14 is carried out of the magazine ejection unit 17 by the operator.

In the first embodiment, the magazine conveyance unit 18 is configured to convey the magazine 14 from the magazine supply unit 16 to the magazine holder 15. Furthermore, the magazine conveyance unit 18 is configured to convey the magazine 14 from the magazine holder 15 to the magazine ejection unit 17. The magazine conveyance unit 18 includes a pair of conveyors 181 and a drive 182. The pair of conveyors 181 are driven by the drive 182 and are configured to convey the magazine 14 in the X direction. The conveyors 181 are arranged so as to extend along the X direction. The conveyors 181 include wide belts, resin chains, etc. The drive 182 includes a motor and an encoder.

The magazine conveyance unit 18 is configured to convey the magazine 14 from the magazine supply unit 16 to the magazine holder 15 based on the magazine 14, which is arranged in the magazine holder 15, becoming replaceable. A state in which the magazine 14 is replaceable refers to a state in which the components 11 of the pallets 13 (trays 12) in the magazine 14 are run out, or a state in which the magazine 14 needs to be replaced even when the components 11 remain. When the magazine 14 becomes replaceable, the magazine 14 of the magazine supply unit 16 is carried in the magazine holder 15. Furthermore, in parallel with the carrying-in of the magazine 14, the magazine 14 of the magazine holder 15 is carried out to the magazine ejection unit 17.

The magazine 14 is moved from the magazine supply unit 16 to the magazine holder 15 along a substantially horizontal direction. Furthermore, the magazine 14 is moved from the magazine holder 15 to the magazine ejection unit 17 along the substantially horizontal direction. That is, the upper surfaces of the magazine supply unit 16, the magazine holder 15, and the magazine ejection unit 17, on which the magazine 14 is placed, are arranged at substantially the same height.

The magazine supply unit 16, the magazine holder 15, and the magazine ejection unit 17 are arranged along a direction (X direction) parallel to the conveyance direction of the substrate P of the component mounting device 100. That is, the magazine supply unit 16, the magazine holder 15, and the magazine ejection unit 17 are linearly arranged along the X direction.

The pallet conveyance unit 19 is configured to convey the pallet 13 from the magazine 14 arranged in the magazine holder 15 to the component supply position. Furthermore, the pallet conveyance unit 19 is configured to convey the pallet 13 at the component supply position to the magazine 14 arranged in the magazine holder 15. At the component supply position, the mounting heads 42 can suction the components 11. The pallet conveyance unit 19 includes a stage 191 and a drive 192. The stage 191 is driven by the drive 192 and is configured to convey the pallet 13 (tray 12) in the upward-downward direction. The pallet 13 is moved from the magazine 14 to the stage 191 by a mechanism configured to put the pallet 13 in and take the pallet 13 out in a state in which the stage 191 is arranged at a position of the magazine 14 at which the pallet 13 to be conveyed is stored. Furthermore, the pallet 13 is transferred from the stage 191 to the magazine 14 by the mechanism configured to put the pallet 13 in and take the pallet 13 out in a state in which the stage 191 is arranged at a position of the magazine 14 at which the pallet 13 is to be stored. The drive 192 includes a motor and an encoder.

(Description of Magazine Replacement Operation)

The magazine replacement operation of the component supply devices 10 is now described with reference to FIG. 4.

Figure 4:
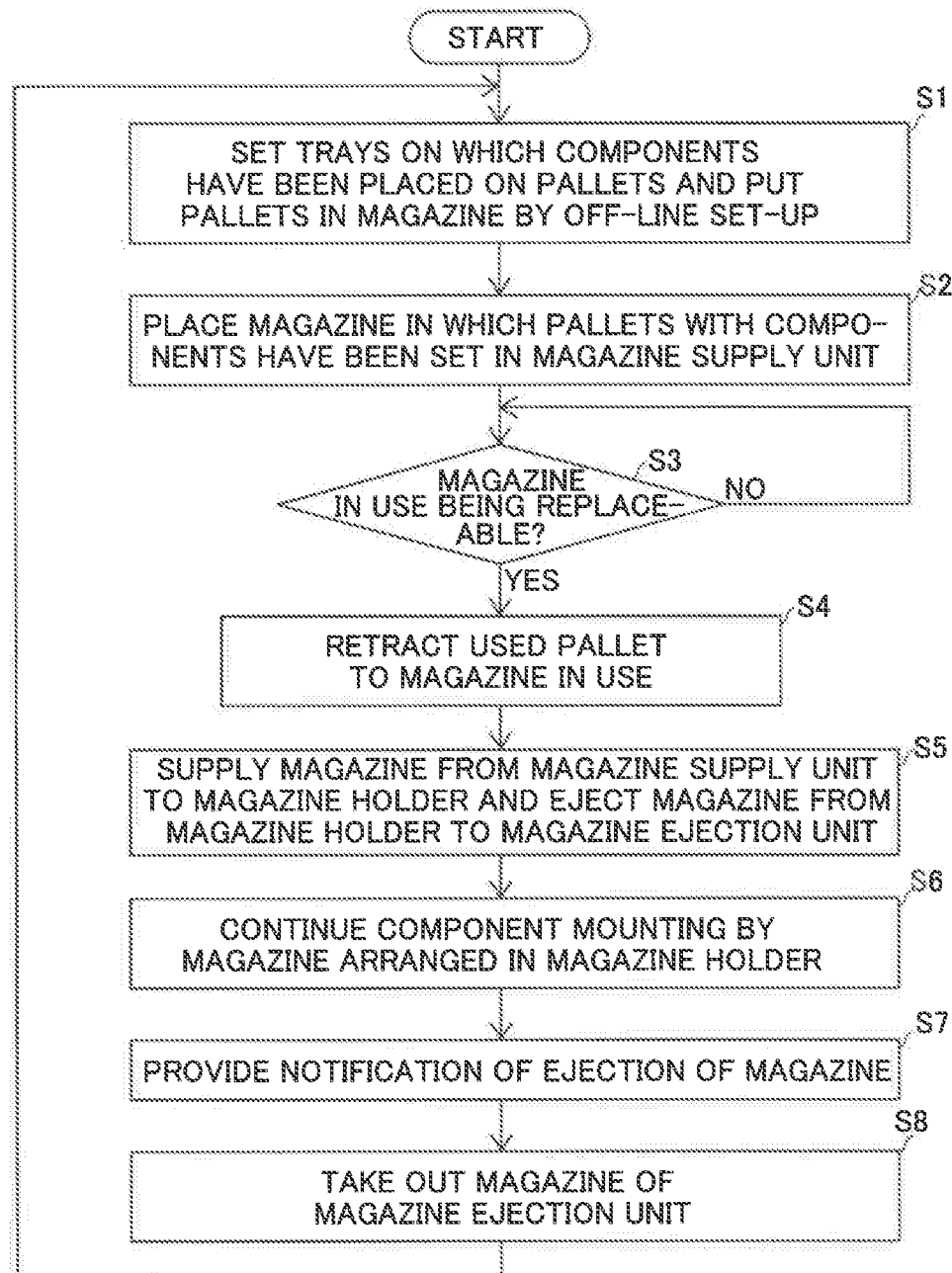
FIG. 4 is a flowchart for illustrating the magazine replacement operation of the component supply device according to the first embodiment of the present disclosure.

In step S1 of FIG. 4, the trays 12 on which the components 11 have been placed are set on the pallets 13, and the pallets 13 are put in the magazine 14 by off-line set-up. In step S2, the magazine 14 in which the pallets 13 with the components 11 have been set is placed in the magazine supply unit 16.

In step S3, it is determined whether or not the magazine 14 in use placed in the magazine holder 15 is replaceable. This determination is made by the controller 8 of the component mounting device 100. When the replacement is possible, the process advances to step S4. When the replacement is not possible, the process operation in step S3 is repeated. In step S4, the used pallet 13 is retracted to the magazine 14 in use. The pallet 13 in use may be continuously used. Thus, the set-up time can be reduced. In this case, an empty tier for collecting the pallet 13 may be provided in the subsequent magazine 14. When there is no tier for collecting the pallet 13, the magazine 14 is ejected when the magazine 14 is filled with the pallets 13 in which the components 11 have been run out.

In step S5, the magazine 14 is supplied from the magazine supply unit 16 to the magazine holder 15. Furthermore, the magazine 14 is ejected from the magazine holder 15 to the magazine ejection unit 17. That is, the magazine 14 is carried in and carried out simultaneously. In step S6, mounting of the components 11 is continued by the magazine 14 arranged in the magazine holder 15.

In step S7, it is notified that that the magazine 14 has been ejected. For example, a notifier of the component mounting device 100 provides notification. In step S8, the magazine 14 of the magazine ejection unit 17 is taken out. Then, the process returns to step S1.

Advantageous Effects of First Embodiment

According to the first embodiment, the following advantageous effects are achieved.

According to the first embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, the magazine conveyance unit 18 can convey the magazine 14 that holds a plurality of pallets 13 from the magazine supply unit 16 to the magazine holder 15 at which the pallets 13 on which the trays 12 have been arranged can be supplied, and thus it is possible to automatically make replenishment of the components 11 placed on the trays 12. Consequently, the operator's operation is not required when replenishment of the components 11 is made by the magazine 14, and thus it is possible to significantly reduce or prevent an increase in the work burden on the operator performing a component replenishment operation. In addition, it is possible to reduce the waiting time for the operator to make replenishment of the components. Thus, it is possible to significantly reduce or prevent prolonged interruption of the component mounting operation. Furthermore, the time required for component replenishment can be reduced as compared with a case in which the operator performs an operation on the pallets 13 one by one.

According to the first embodiment, as described above, the magazine conveyance unit 18 is configured to convey the magazine 14 from the magazine supply unit 16 to the magazine holder 15 based on the magazine 14, which has been arranged in the magazine holder 15, becoming replaceable. Accordingly, when the magazine 14 of the magazine holder 15 has become replaceable, the magazine 14 is automatically supplied by the magazine conveyance unit 18, and thus the operator does not need to replace the magazine 14. Thus, it is possible to effectively significantly reduce or prevent an increase in the work burden on the operator performing a component replenishment operation.

According to the first embodiment, as described above, the magazine 14 is configured to be moved from the magazine supply unit 16 to the magazine holder 15 along the substantially horizontal direction. Accordingly, the magazine 14 that holds a plurality of trays 12 on which the unmounted components 11 have been arranged can be placed in the magazine holder 15 by moving in the substantially horizontal direction, and thus unlike a case in which the magazine 14 moves in the upward-downward direction, it is possible to significantly reduce or prevent movement of the components 11 due to vibrations or the like during movement of the magazine 14. Consequently, it is possible to significantly reduce or prevent movement and a change in the orientations of the components 11 arranged on the tray 12.

According to the first embodiment, as described above, the magazine supply unit 16, the magazine holder 15, and the magazine ejection unit 17 are arranged along the direction (X direction) parallel to the conveyance direction of the substrate P of the component mounting device 100. Accordingly, the magazine supply unit 16 and the magazine ejection unit 17 can be arranged without interfering with another device connected in the conveyance direction of the substrate P of the component mounting device 100.

Second Embodiment

The structure of a component supply device 10a according to a second embodiment of the present disclosure is described with reference to FIGS. 5 and 6. In this second embodiment, an example of a structure in which a slope 171 is provided in a magazine ejection unit 17 is described.

(Structure of Component Supply Device)

Figure 5:
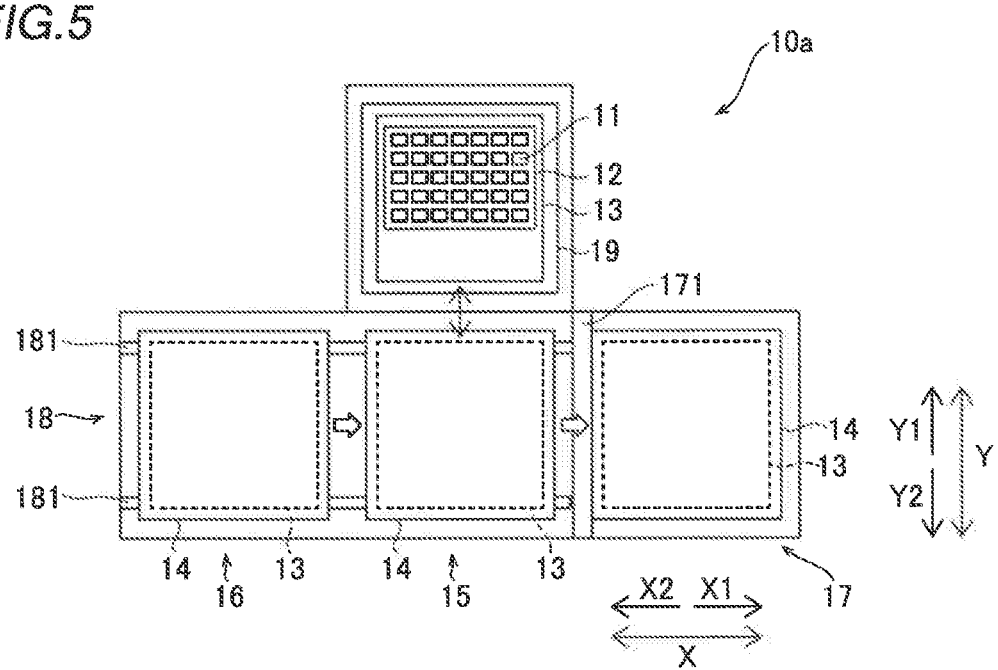
FIG. 5 is a plan view showing a component supply device according to a second embodiment of the present disclosure.

As shown in FIG. 5, the component supply device 10a is configured to supply components 11 to mounting heads 42 of a component mounting device 100 that mounts the components 11 on a substrate P. The component supply device 10a includes pallets 13, magazines 14, a magazine holder 15, a magazine supply unit 16, a magazine ejection unit 17, a magazine conveyance unit 18, and a pallet conveyance unit 19.

Figure 6:
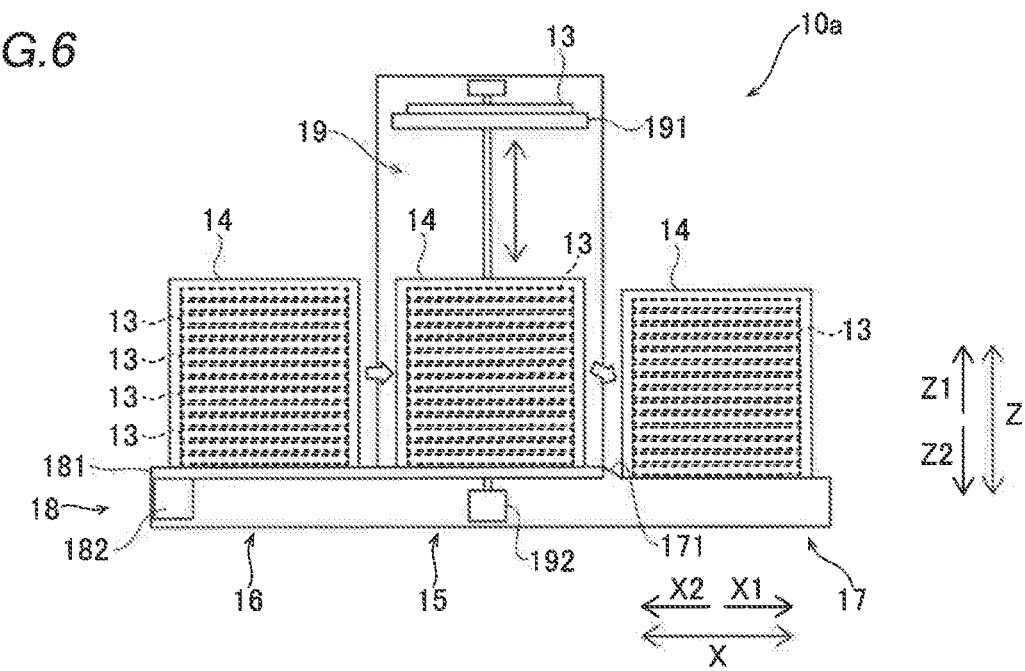
FIG. 6 is a front view showing the component supply device according to the second embodiment of the present disclosure.

In the second embodiment, as shown in FIG. 6, the magazine ejection unit 17 includes the slope 171 formed at a boundary with the magazine holder 15. Furthermore, the magazine 14 is configured to be moved from the magazine holder 15 to the magazine ejection unit 17 down the slope 171. That is, conveyors 181 of the magazine conveyance unit 18 are arranged from the magazine supply unit 16 to the magazine holder 15.

The magazine conveyance unit 18 conveys the magazine 14 from the magazine supply unit 16 to the magazine holder 15. Furthermore, the magazine conveyance unit 18 conveys the magazine 14 from the magazine holder 15 to the slope 171 of the magazine conveyance unit 17. The magazine 14 conveyed to the slope 171 is further conveyed down the slope 171. That is, the used magazine 14 moves down the slope 171 due to its own weight.

The remaining structures of the second embodiment are similar to those of the first embodiment.

According to the second embodiment, the following advantageous effects are achieved.

According to the second embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on an operator performing a component replenishment operation and to significantly reduce or prevent prolonged interruption of the component mounting operation.

According to the second embodiment, as described above, the magazine ejection unit 17 includes the slope 171 formed at the boundary with the magazine holder 15. Furthermore, the magazine 14 is configured to be moved from the magazine holder 15 to the magazine ejection unit 17 down the slope 171. Accordingly, it is not necessary to provide a conveyance unit in the magazine ejection unit, and thus the device structure can be simplified.

The remaining advantageous effects of the second embodiment are similar to those of the first embodiment.

Third Embodiment

The structure of a component supply device 10b according to a third embodiment of the present disclosure is now described with reference to FIGS. 7 and 8. In this third embodiment, an example of a structure in which tape feeders 30 are provided above a magazine supply unit 16 and a magazine ejection unit 17 is described.

(Structure of Component Supply Device)

Figure 7:
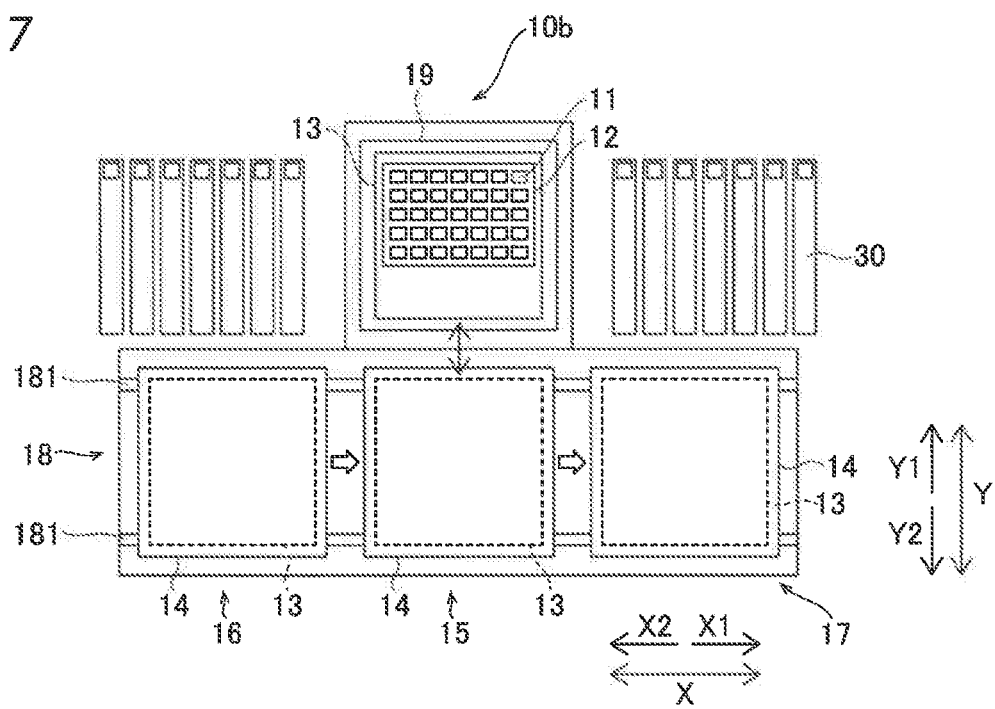
FIG. 7 is a plan view showing a component supply device according to a third embodiment of the present disclosure.

As shown in FIG. 7, the component supply device 10b is configured to supply components 11 to mounting heads 42 of a component mounting device 100 that mounts the components 11 on a substrate P. The component supply device 10b includes pallets 13, magazines 14, a magazine holder 15, the magazine supply unit 16, the magazine ejection unit 17, a magazine conveyance unit 18, and a pallet conveyance unit 19.

In the third embodiment, a plurality of tape feeders 30 are arranged on each of the opposite sides of the component supply device 10b in an X direction. The plurality of tape feeders 30 are attached to the component mounting device 100 without a trolley. Below the tape feeders 30, storages that store tapes from which components 31 have been removed are arranged.

Figure 8:
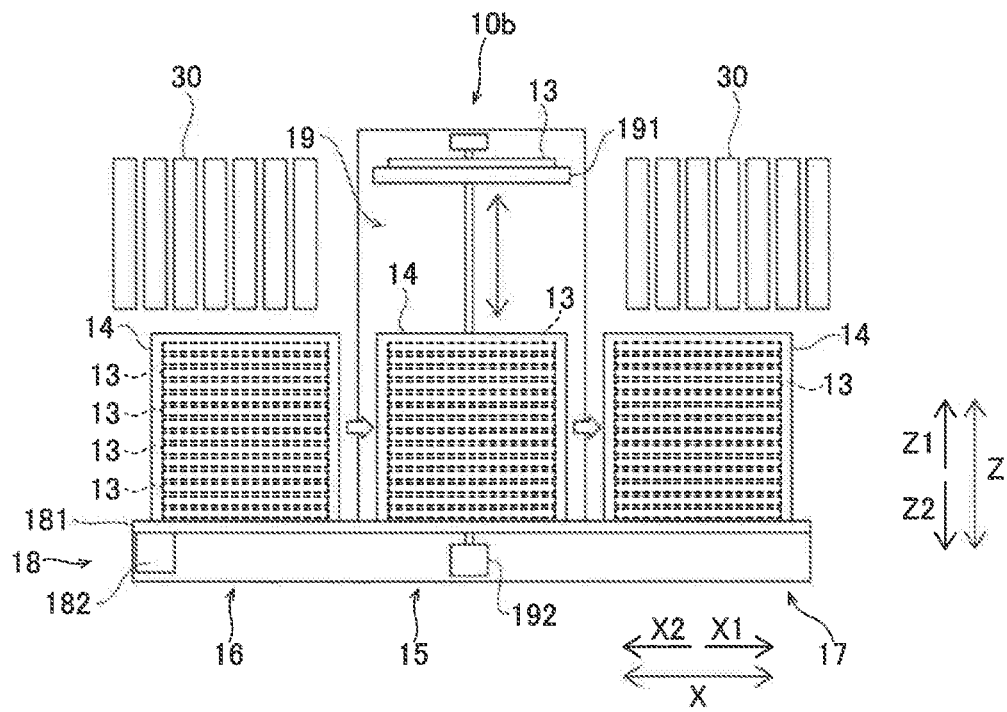
FIG. 8 is a front view showing the component supply device according to the third embodiment of the present disclosure.

In the third embodiment, as shown in FIG. 8, in a state in which the magazines 14 are placed in the magazine supply unit 16 and the magazine ejection unit 17, the magazine supply unit 16 and the magazine ejection unit 17 are arranged at positions lower than the installation heights of the tape feeders 30, which supply the components 31 held on tapes to the component mounting device 100, of the component mounting device 100. As shown in FIG. 7, the magazine supply unit 16, the magazine holder 15, and the magazine ejection unit 17 are arranged at positions (Y2 direction side) farther from the component mounting device 100 than the tape feeders 30.

The remaining structures of the third embodiment are similar to those of the first embodiment.

According to the third embodiment, the following advantageous effects are achieved.

According to the third embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on an operator performing a component replenishment operation and to significantly reduce or prevent prolonged interruption of the component mounting operation.

According to the third embodiment, as described above, the magazine supply unit 16 and the magazine ejection unit 17 are arranged at the positions lower than the installation heights of the tape feeders 30, which supply the components 31 held on the tapes to the component mounting device 100, of the component mounting device 100. Accordingly, the magazine supply unit 16 and the magazine ejection unit 17 are arranged in a space below the tape feeders 30 such that the space can be effectively utilized. Furthermore, when the operator accesses the tape feeders 30, interference of the magazine supply unit 16 and the magazine ejection unit 17 can be significantly reduced or prevented.

The remaining advantageous effects of the third embodiment are similar to those of the first embodiment.

Fourth Embodiment

The structure of a component supply device 10c according to a fourth embodiment of the present disclosure is now described with reference to FIGS. 9 and 10. In this fourth embodiment, an example of a structure in which a magazine supply unit 16 and a magazine ejection unit 17 are attachable and detachable is described.

(Structure of Component Supply Device)

Figure 9:
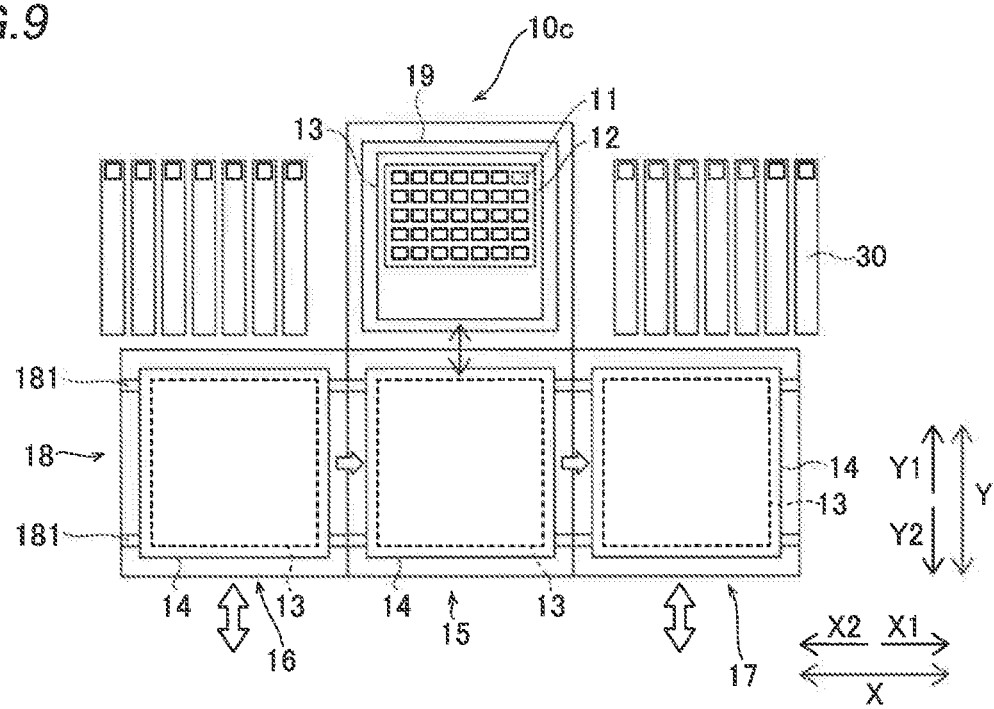
FIG. 9 is a plan view showing a component supply device according to a fourth embodiment of the present disclosure.

As shown in FIG. 9, the component supply device 10c is configured to supply components 11 to mounting heads 42 of a component mounting device 100 that mounts the components 11 on a substrate P. The component supply device 10c includes pallets 13, magazines 14, a magazine holder 15, the magazine supply unit 16, the magazine ejection unit 17, a magazine conveyance unit 18, and a pallet conveyance unit 19.

Figure 10:
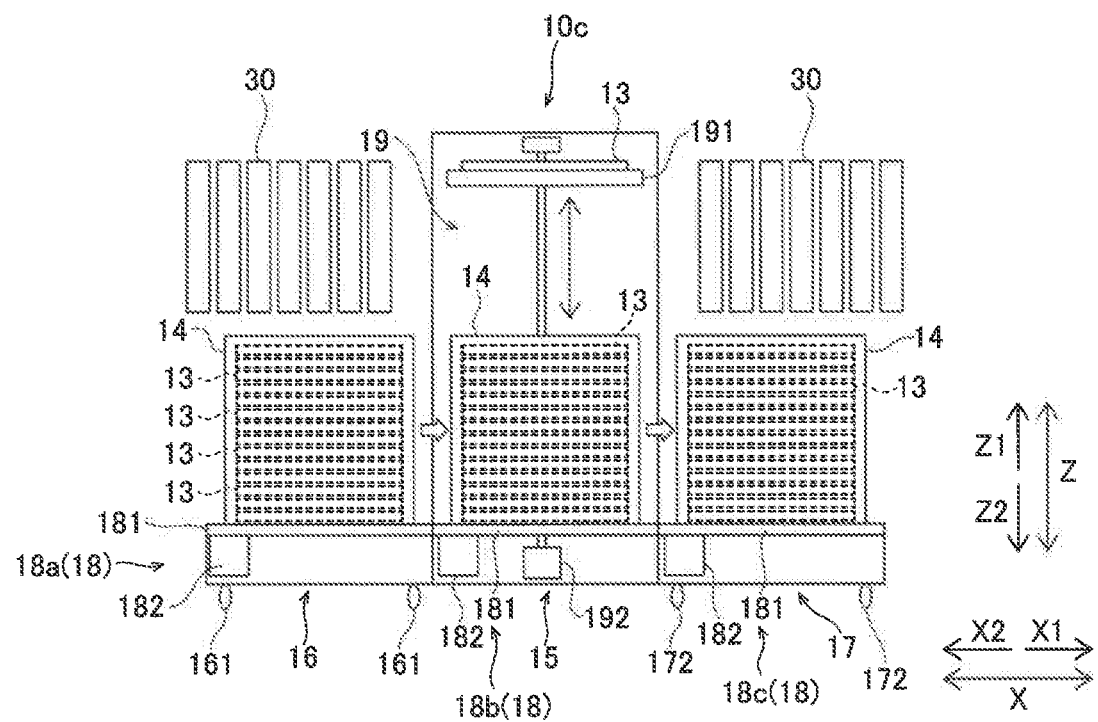
FIG. 10 is a front view showing the component supply device according to the fourth embodiment of the present disclosure.

In the fourth embodiment, as shown in FIGS. 9 and 10, the magazine supply unit 16 and the magazine ejection unit 17 are configured to be attachable to and detachable from a device main body in which the magazine holder 15 is arranged. Specifically, the magazine supply unit 16 is detachably connected to the magazine holder 15. Furthermore, the magazine ejection unit 17 is detachably connected to the magazine holder 15. The magazine supply unit 16 includes wheels 161. Thus, the magazine supply unit 16 can be easily moved. The magazine supply unit 16 moves in a Y direction with respect to the magazine holder 15. The magazine ejection unit 17 includes wheels 172. Thus, the magazine ejection unit 17 can be easily moved. The magazine ejection unit 17 moves in the Y direction with respect to the magazine holder 15.

The magazine conveyance unit 18 includes a first conveyance unit 18a provided in the magazine supply unit 16, a second conveyance unit 18b provided in the magazine holder 15, and a third conveyance unit 18c provided in the magazine ejection unit 17. The first conveyance unit 18a, the second conveyance unit 18b, and the third conveyance unit 18c each include a pair of conveyors 181 and a drive 182. The first conveyance unit 18a, the second conveyance unit 18b, and the third conveyance unit 18c are driven in cooperation with each other such that the magazine 14 is carried in and carried out simultaneously.

The remaining structures of the fourth embodiment are similar to those of the third embodiment.

According to the fourth embodiment, the following advantageous effects are achieved.

According to the fourth embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on an operator performing a component replenishment operation and to significantly reduce or prevent prolonged interruption of the component mounting operation.

According to the fourth embodiment, as described above, the magazine supply unit 16 and the magazine ejection unit 17 are configured to be attachable to and detachable from the device main body in which the magazine holder 15 is arranged. Accordingly, the magazine supply unit 16 and the magazine ejection unit 17 can be removed from the device main body and be moved, and thus the operator can easily access the component mounting device 100. Consequently, maintenance of the component mounting device 100 can be easily performed. For example, a reel replenishment operation, a reel replacement operation, a tape feeder 30 replacement operation, a replacement operation for a batch replacement trolley in which a plurality of tape feeders 30 are arranged, an empty tape discharge (trash box collection) operation, and other maintenance operations can be easily performed.

The remaining advantageous effects of the fourth embodiment are similar to those of the first embodiment.

Fifth Embodiment

The structure of a component supply device 10d according to a fifth embodiment of the present disclosure is now described with reference to FIGS. 11 and 12. In this fifth embodiment, an example of a structure in which transmission mechanisms 183 and 184 configured to transmit a driving force to a magazine conveyance unit 18 are provided is described.

(Structure of Component Supply Device)

Figure 11:
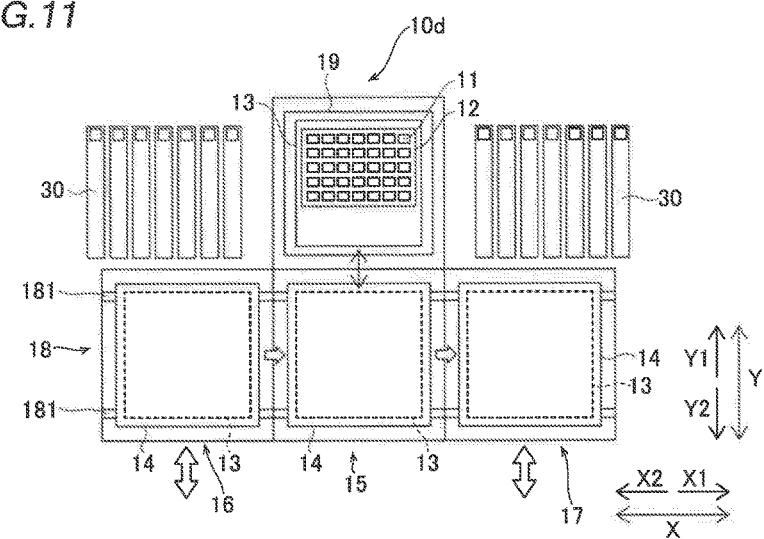
FIG. 11 is a plan view showing a component supply device according to a fifth embodiment of the present disclosure.

As shown in FIG. 11, the component supply device 10d is configured to supply components 11 to mounting heads 42 of a component mounting device 100 that mounts the components 11 on a substrate P. The component supply device 10d includes pallets 13, magazines 14, a magazine holder 15, a magazine supply unit 16, a magazine ejection unit 17, a magazine conveyance unit 18, and a pallet conveyance unit 19.

Figure 12:
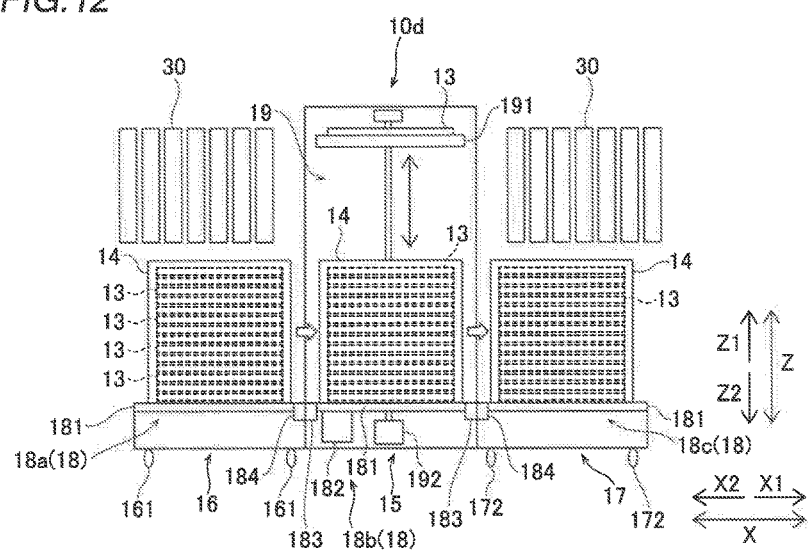
FIG. 12 is a front view showing the component supply device according to the fifth embodiment of the present disclosure.

In the fifth embodiment, as shown in FIGS. 11 and 12, the magazine supply unit 16 and the magazine ejection unit 17 are configured to be attachable to and detachable from a device main body in which the magazine holder 15 is arranged. A first conveyance unit 18a, a second conveyance unit 18b, and a third conveyance unit 18c are configured to be driven by a common drive 182. Specifically, the first conveyance unit 18a includes conveyors 181 and the transmission mechanism 184. The second conveyance unit 18b includes conveyors 181, the drive 182, and the transmission mechanisms 183. The third conveyance unit 18c includes conveyors 181 and the transmission mechanism 184.

The transmission mechanisms 183 and 184 are configured to transmit the driving force of the second conveyance unit 18b to the first conveyance unit 18a and the third conveyance unit 18c. The transmission mechanisms 183 and 184 include gears and clutches. The driving force of the drive 182 is transmitted to the transmission mechanisms 183. Furthermore, the transmission mechanisms 183 transmit the transmitted driving force to the transmission mechanisms 184. The magazine supply unit 16 (magazine ejection unit 17) is connected to the magazine holder 15 such that the gears of the transmission mechanisms 183 and 184 mesh with each other.

The remaining structures of the fifth embodiment are similar to those of the fourth embodiment.

According to the fifth embodiment, the following advantageous effects are achieved.

According to the fifth embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on an operator performing a component replenishment operation and to significantly reduce or prevent prolonged interruption of the component mounting operation.

According to the fifth embodiment, as described above, the first conveyance unit 18a, the second conveyance unit 18b, and the third conveyance unit 18c are configured to be driven by the common drive 182. Accordingly, as compared with a case in which a drive is provided in each of the first conveyance unit 18a, the second conveyance unit 18b, and the third conveyance unit 18c, the number of components can be reduced, and the device structure of the magazine conveyance unit 18 can be further simplified.

The remaining advantageous effects of the fifth embodiment are similar to those of the first embodiment.

Sixth Embodiment

The structure of a component supply device 10e according to a sixth embodiment of the present disclosure is now described with reference to FIGS. 13 to 15. In this sixth embodiment, an example of a structure in which a magazine supply unit 16 and a magazine ejection unit 17 are foldable is described.

(Structure of Component Supply Device)

Figure 13:
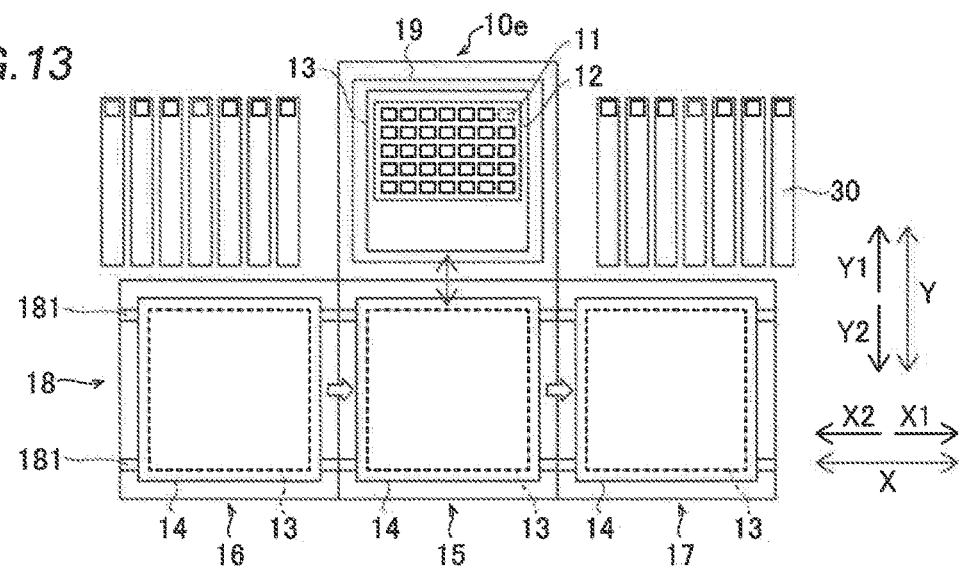
FIG. 13 is a plan view showing a component supply device according to a sixth embodiment of the present disclosure.

As shown in FIG. 13, the component supply device 10e is configured to supply components 11 to mounting heads 42 of a component mounting device 100 that mounts the components 11 on a substrate P. The component supply device 10e includes pallets 13, magazines 14, a magazine holder 15, the magazine supply unit 16, the magazine ejection unit 17, a magazine conveyance unit 18, and a pallet conveyance unit 19.

Figure 14:
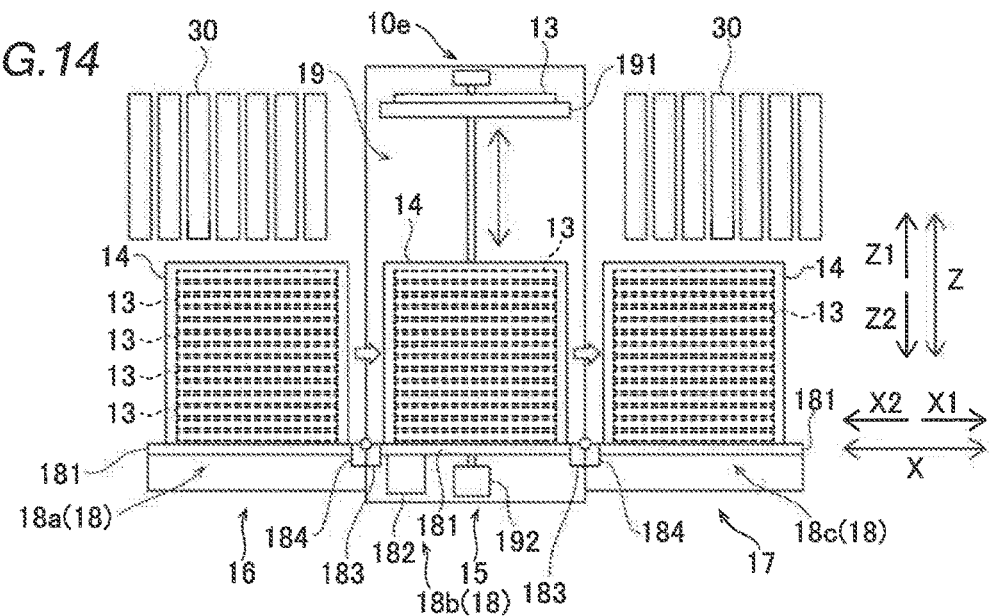
FIG. 14 is a front view showing the component supply device according to the sixth embodiment of the present disclosure.
Figure 15:
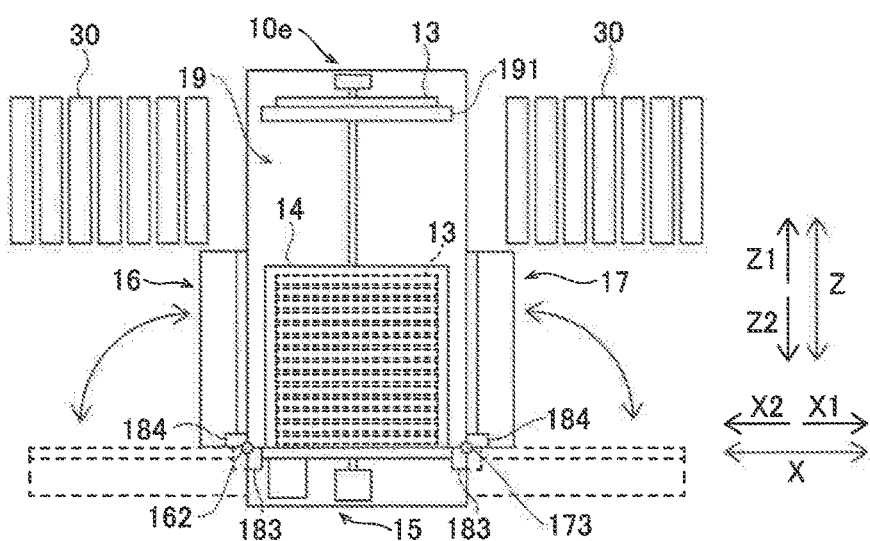
FIG. 15 is a front view showing a state in which a magazine supply unit and a magazine ejection unit of the component supply device according to the sixth embodiment of the present disclosure are folded.

In the sixth embodiment, as shown in FIGS. 13 to 15, the magazine supply unit 16 and the magazine ejection unit 17 are configured to be foldable with respect to a device main body in which the magazine holder 15 is arranged. Specifically, the magazine supply unit 16 includes a rotation shaft 162. The rotation shaft 162 extends in a Y direction. As shown in FIG. 15, the magazine supply unit 16 is rotatable about the rotation shaft 162. That is, when the magazine 14 is not arranged in the magazine supply unit 16, the magazine supply unit 16 can be folded. Furthermore, the magazine ejection unit 17 includes a rotation shaft 173. The rotation shaft 173 extends in the Y direction. The magazine ejection unit 17 is rotatable about the rotation shaft 173. That is, when the magazine 14 is not arranged in the magazine ejection unit 17, the magazine ejection unit 17 can be folded. A first conveyance unit 18a, a second conveyance unit 18b, and a third conveyance unit 18c are configured to be driven by a common drive 182.

The remaining structures of the sixth embodiment are similar to those of the fifth embodiment.

According to the sixth embodiment, the following advantageous effects are achieved.

According to the sixth embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on an operator performing a component replenishment operation and to significantly reduce or prevent prolonged interruption of the component mounting operation.

According to the sixth embodiment, as described above, the magazine supply unit 16 and the magazine ejection unit 17 are configured to be foldable with respect to a device main body in which the magazine holder 15 is arranged. Accordingly, the magazine supply unit 16 and the magazine ejection unit 17 are folded such that it is possible to ensure a maintenance space for the component supply device 10e and the component mounting device 100, and thus maintainability can be improved.

The remaining advantageous effects of the sixth embodiment are similar to those of the first embodiment.

Seventh Embodiment

The structure of a component supply device 10f according to a seventh embodiment of the present disclosure is now described with reference to FIGS. 16 and 17. In this seventh embodiment, an example of a structure in which a magazine circulation unit 20 is provided is described.

(Structure of Component Supply Device)

Figure 16:
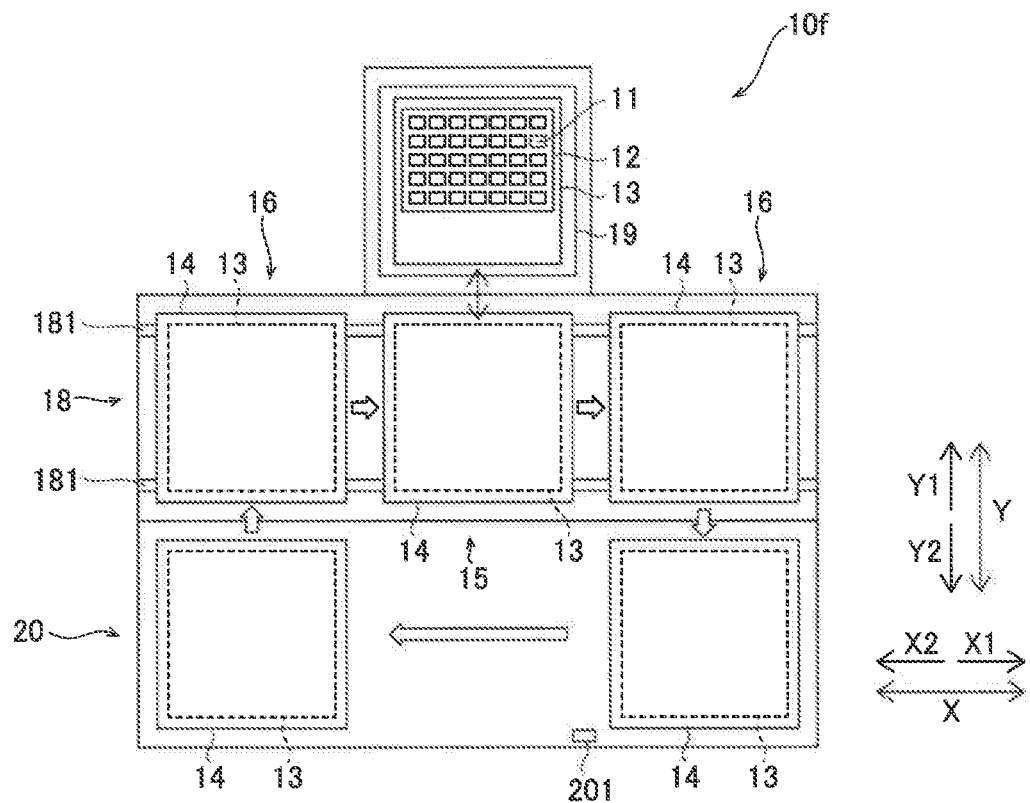
FIG. 16 is a plan view showing a component supply device according to a seventh embodiment of the present disclosure.

As shown in FIG. 16, the component supply device 10f is configured to supply components 11 to mounting heads 42 of a component mounting device 100 that mounts the components 11 on a substrate P. The component supply device 10f includes pallets 13, magazines 14, a magazine holder 15, a magazine supply unit 16, a magazine ejection unit 17, a magazine conveyance unit 18, a pallet conveyance unit 19, and the magazine circulation unit 20.

Figure 17:
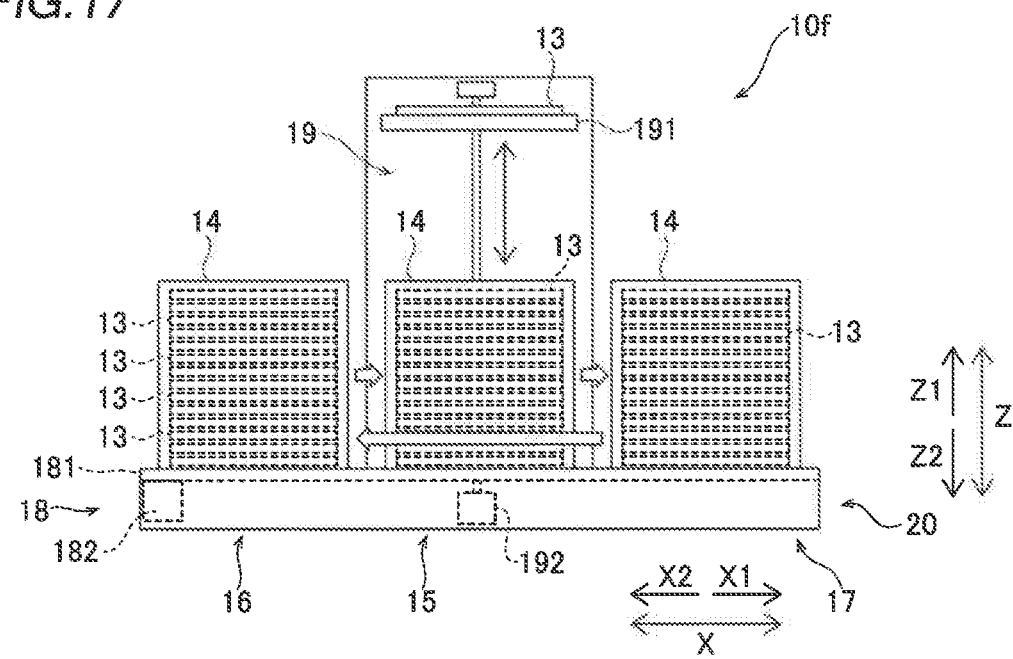
FIG. 17 is a front view showing the component supply device according to the seventh embodiment of the present disclosure.

In the seventh embodiment, as shown in FIGS. 16 and 17, the magazine circulation unit 20 is configured to receive the magazine 14 from the magazine ejection unit 17 and move the magazine 14 to the magazine supply unit 16. The magazine circulation unit 20 is arranged in an opposite direction (Y2 direction side) to the component mounting device 100 with respect to the magazine supply unit 16, the magazine holder 15, and the magazine ejection unit 17. The magazine circulation unit 20 receives the magazine 14 from the magazine ejection unit 17, and returns the magazine 14 to the magazine supply unit 16. Furthermore, at the magazine circulation unit 20, an operator replenishes the magazine 14 with the components 11 (tray 12) on the way.

The magazine circulation unit 20 includes a component replenishment completion button 201. When the operator replenishes the magazine 14 with the components 11 and presses the component replenishment completion button 201, the magazine circulation unit 20 moves the magazine 14 from a magazine replenishment position to a magazine standby position. The magazine 14 is on standby at the magazine standby position. When the magazine 14 in the magazine supply unit 16 is supplied to the magazine holder 15 and the magazine supply unit 16 becomes empty, the magazine 14 at the magazine standby position is moved to the magazine supply unit 16.

The remaining structures of the seventh embodiment are similar to those of the first embodiment.

According to the seventh embodiment, the following advantageous effects are achieved.

According to the seventh embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on the operator performing a component replenishment operation and to significantly reduce or prevent prolonged interruption of the component mounting operation.

According to the seventh embodiment, as described above, the magazine circulation unit 20 that receives the magazine 14 from the magazine ejection unit 17 and moves the magazine 14 to the magazine supply unit 16 is provided. Accordingly, replenishment of the components 11 is made in the magazine circulation unit 20 such that the magazine 14 of the magazine ejection unit 17 can be returned to the magazine supply unit 16, and thus it is not necessary to convey the magazine 14 to the magazine supply unit 16 or take out the magazine 14 from the magazine ejection unit 17. Thus, the work burden on the operator can be further reduced.

The remaining advantageous effects of the seventh embodiment are similar to those of the first embodiment.

Eighth Embodiment

The structure of a component supply device 10g according to an eighth embodiment of the present disclosure is now described with reference to FIGS. 18 and 19. In this eighth embodiment, an example of a structure in which a self-propelled trolley 21 is provided is described.

(Structure of Component Supply Device)

Figure 18:
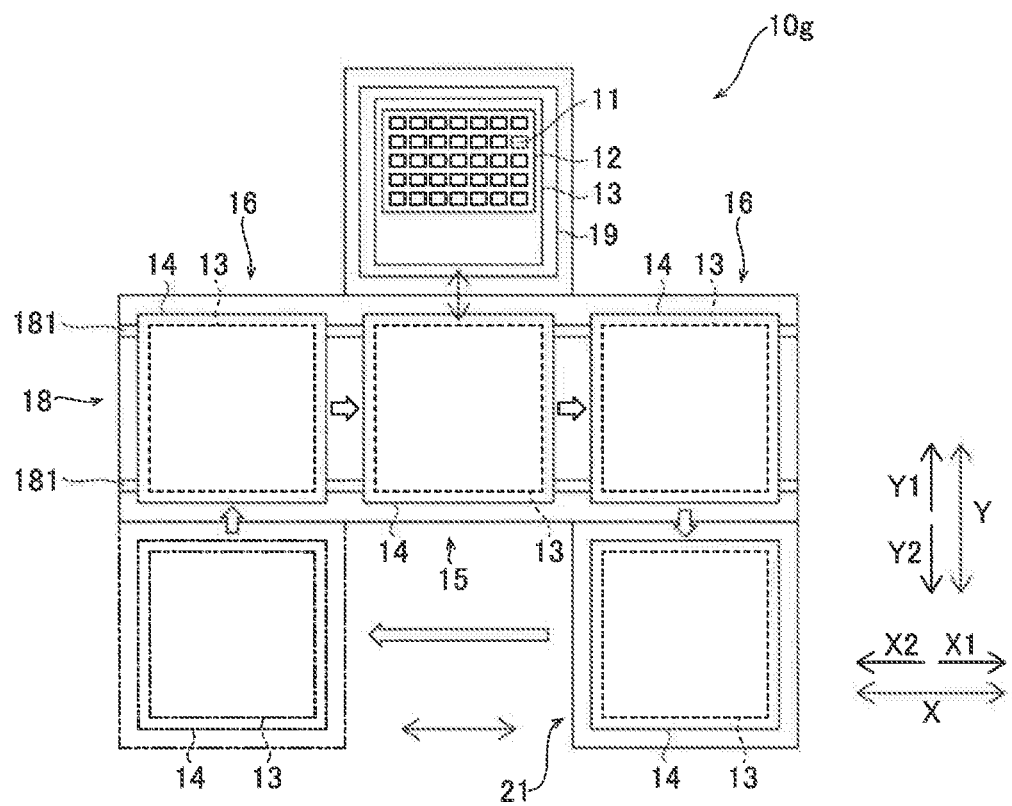
FIG. 18 is a plan view showing a component supply device according to an eighth embodiment of the present disclosure.

As shown in FIG. 18, the component supply device 10g is configured to supply components 11 to mounting heads 42 of a component mounting device 100 that mounts the components 11 on a substrate P. The component supply device 10g includes pallets 13, magazines 14, a magazine holder 15, a magazine supply unit 16, a magazine ejection unit 17, a magazine conveyance unit 18, a pallet conveyance unit 19, and the self-propelled trolley 21.

Figure 19:
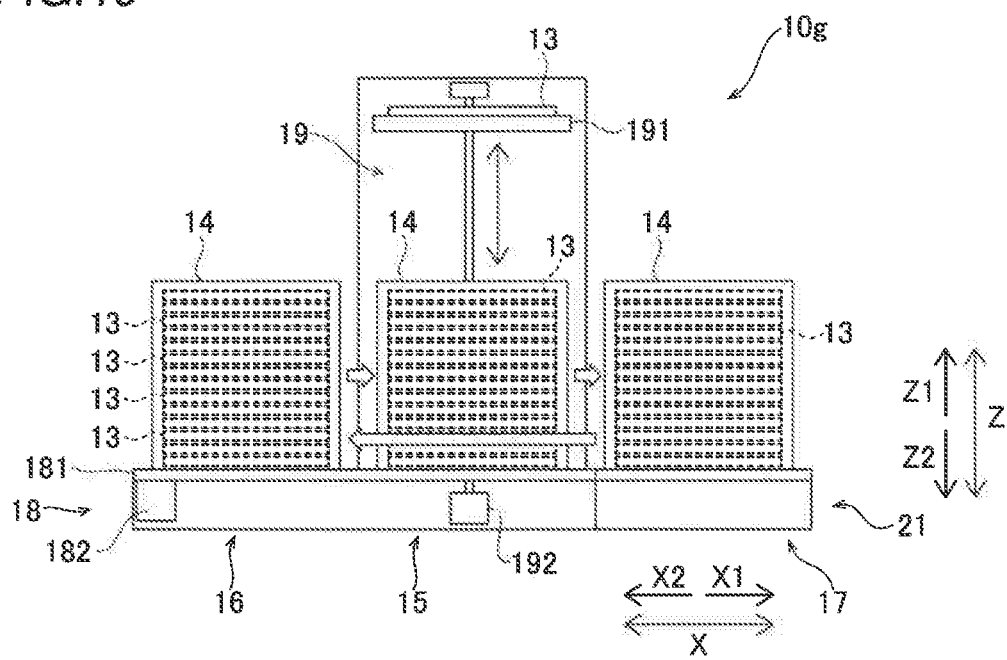
FIG. 19 is a front view showing the component supply device according to the eighth embodiment of the present disclosure.

In the eighth embodiment, as shown in FIGS. 18 and 19, the self-propelled trolley 21 is configured to convey the magazine 14 to the magazine supply unit 16 and convey the magazine from the magazine ejection unit 17. Specifically, the self-propelled trolley 21 is self-propellable. Furthermore, the self-propelled trolley 21 is arranged in an opposite direction (Y2 direction side) to the component mounting device 100 with respect to the magazine supply unit 16, the magazine holder 15, and the magazine ejection unit 17. The self-propelled trolley 21 receives the magazine 14 from the magazine ejection unit 17, and returns the magazine 14 to the magazine supply unit 16. Furthermore, at the self-propelled trolley 21, an operator replenishes the magazine 11 with the components 11 (tray 12) on the way. A mechanism configured to carry the magazine 14 in the self-propelled trolley 21 and a mechanism configured to carry the magazine 14 out of the self-propelled trolley 21 may be provided in the self-propelled trolley 21, or in the magazine supply unit 16 and the magazine ejection unit 17.

The remaining structures of the eighth embodiment are similar to those of the seventh embodiment.

According to the eighth embodiment, the following advantageous effects are achieved.

According to the eighth embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on the operator performing a component replenishment operation and to significantly reduce or prevent prolonged interruption of the component mounting operation.

According to the eighth embodiment, as described above, the self-propelled trolley 21 that is self-propellable is configured to convey the magazine 14 to the magazine supply unit 16 and convey the magazine from the magazine ejection unit 17. Accordingly, the operator does not need to convey the magazine 14 to the magazine supply unit 16 or convey the magazine 14 from the magazine ejection unit 17, and thus the work burden on the operator can be further reduced.

The remaining advantageous effects of the eighth embodiment are similar to those of the first embodiment.

Ninth Embodiment

The structure of a component supply device 10h according to a ninth embodiment of the present disclosure is now described with reference to FIGS. 20 and 21. In this ninth embodiment, an example of a structure in which a suspending conveyance unit 22 configured to convey the magazine 14 is provided is described.

(Structure of Component Supply Device)

Figure 20:
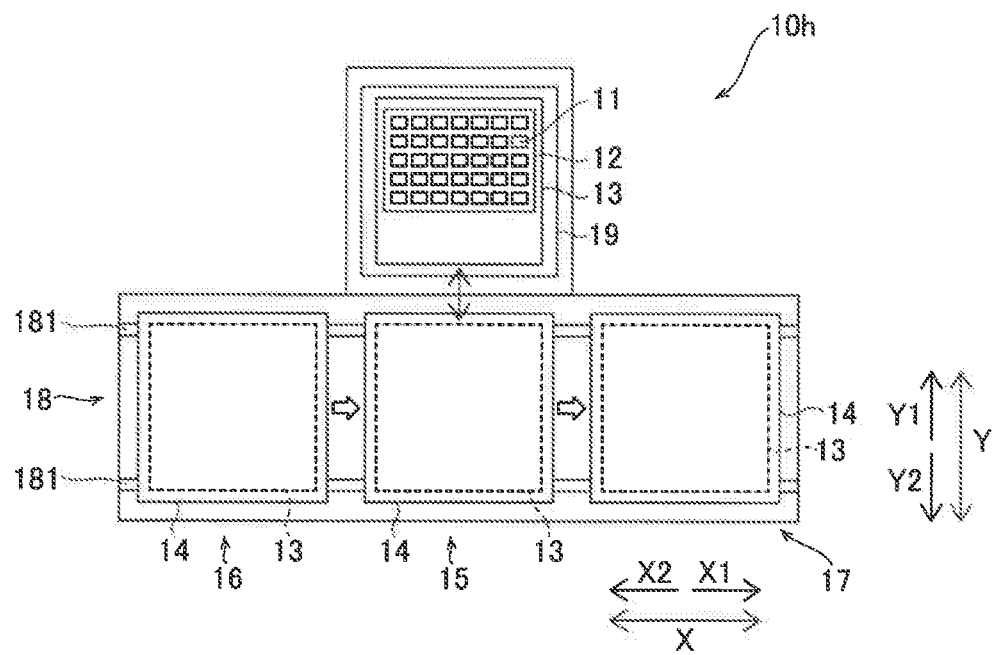
FIG. 20 is a plan view showing a component supply device according to a ninth embodiment of the present disclosure.

As shown in FIG. 20, the component supply device 10h is configured to supply components 11 to mounting heads 42 of a component mounting device 100 that mounts the components 11 on a substrate P. The component supply device 10h includes pallets 13, magazines 14, a magazine holder 15, a magazine supply unit 16, a magazine ejection unit 17, a magazine conveyance unit 18, and a pallet conveyance unit 19.

Figure 21:
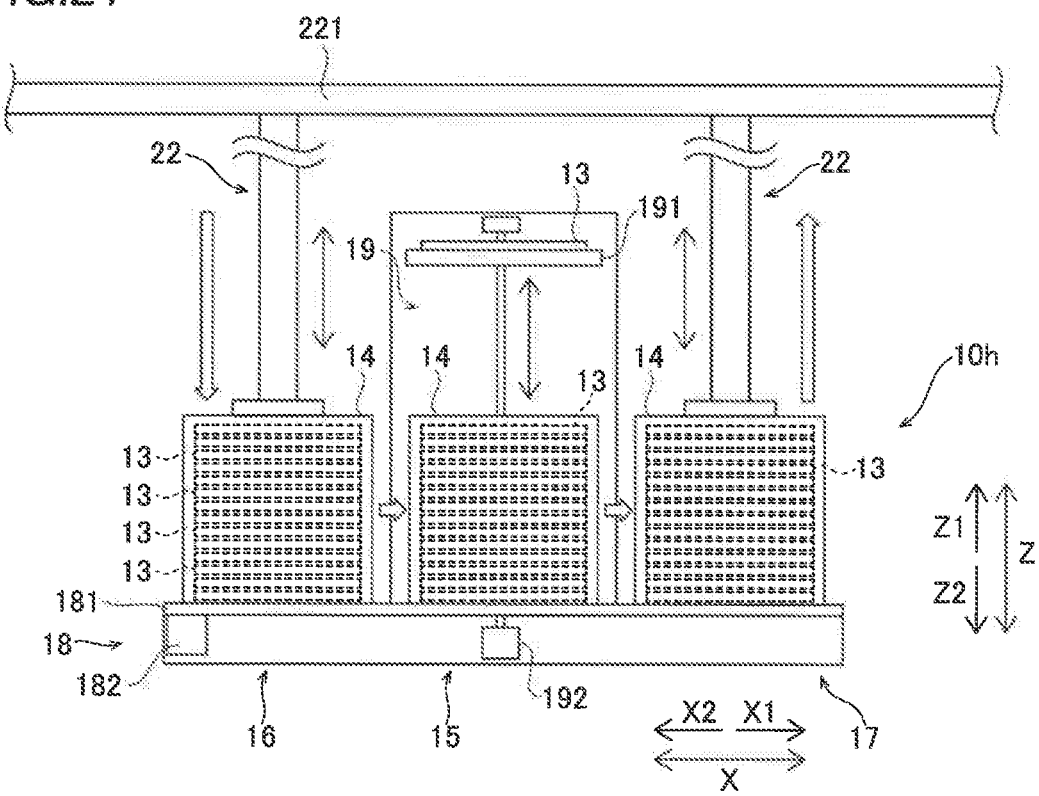
FIG. 21 is a front view showing the component supply device according to the ninth embodiment of the present disclosure.

In the ninth embodiment, as shown in FIG. 21, the magazine 14 is suspended and carried in the magazine supply unit 16. The magazine 14 is suspended and carried out of the magazine ejection unit 17. Specifically, above the component mounting device 100, the suspending conveyance unit 22 that suspends and conveys the magazine 14 is provided. The suspending conveyance unit 22 is installed on the upper side, and moves along a rail 221.

The remaining structures of the ninth embodiment are similar to those of the first embodiment.

According to the ninth embodiment, the following advantageous effects are achieved.

According to the ninth embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on the operator performing a component replenishment operation and to significantly reduce or prevent prolonged interruption of the component mounting operation.

According to the ninth embodiment, as described above, the magazine 14 is suspended and carried in the magazine supply unit 16, and the magazine 14 is suspended and carried out of the magazine ejection unit 17. Accordingly, the conveyance mechanism that suspends and conveys the magazine 14 is provided in a space above the component mounting device 100 and the component supply device 10h, and thus effectively utilizing the upper space, the magazine 14 can be conveyed.

The remaining advantageous effects of the ninth embodiment are similar to those of the first embodiment.

Tenth Embodiment

The structure of a component supply device 10i according to a tenth embodiment of the present disclosure is now described with reference to FIGS. 22 and 23. In this tenth embodiment, an example of a structure in which shutters 23 are provided is described.

(Structure of Component Supply Device)

Figure 22:
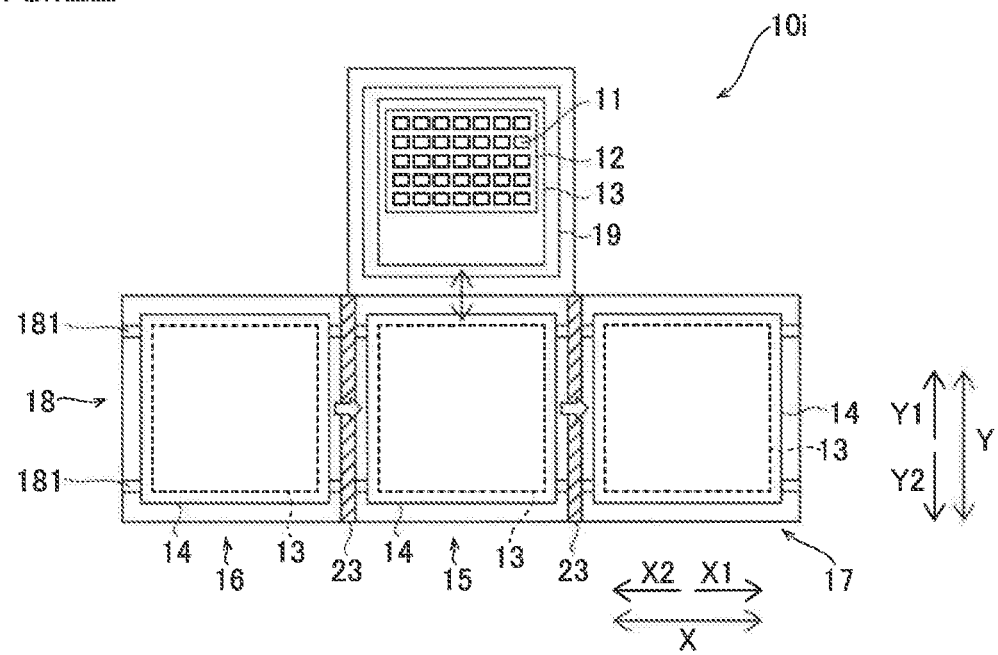
FIG. 22 is a plan view showing a component supply device according to a tenth embodiment of the present disclosure.

As shown in FIG. 22, the component supply device 10i is configured to supply components 11 to mounting heads 42 of a component mounting device 100 that mounts the components 11 on a substrate P. The component supply device 10i includes pallets 13, magazines 14, a magazine holder 15, a magazine supply unit 16, a magazine ejection unit 17, a magazine conveyance unit 18, a pallet conveyance unit 19, and the shutters 23.

Figure 23:
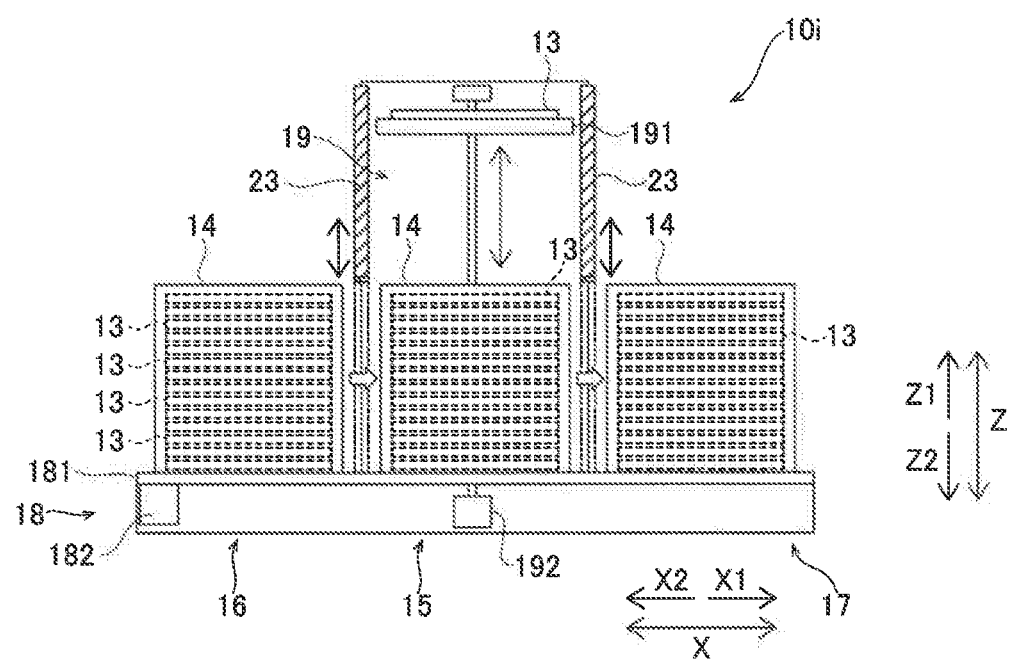
FIG. 23 is a front view showing the component supply device according to the tenth embodiment of the present disclosure.

In the tenth embodiment, as shown in FIG. 23, the shutter 23 is provided on each of the magazine supply unit 16 side and the magazine ejection unit 17 side of the magazine holder 15. Furthermore, the shutters 23 are configured to be opened and closed by moving in an upward-downward direction. The shutter 23 moves upward to open the magazine holder 15 and the magazine supply unit 16 (magazine ejection unit 17). The shutter 23 moves downward to close the magazine holder 15 and the magazine supply unit 16 (magazine ejection unit 17). The shutter 23 separates a space of the magazine holder 15 from a space of the magazine supply unit 16 (magazine ejection unit 17). The shutters 23 are basically closed during the mounting operation of the component mounting device 100. The shutters 23 are opened when the magazine 14 of the magazine holder 15 is replaced.

The remaining structures of the tenth embodiment are similar to those of the first embodiment.

According to the tenth embodiment, the following advantageous effects are achieved.

According to the tenth embodiment, as described above, the magazine supply unit 16 configured to supply the magazine 14 to the magazine holder 15, the magazine ejection unit 17 configured to receive the magazine 14 ejected from the magazine holder 15, and the magazine conveyance unit 18 configured to convey the magazine 14 from the magazine supply unit 16 to the magazine holder 15 are provided. Accordingly, it is possible to significantly reduce or prevent an increase in the work burden on the operator performing a component replenishment operation and to significantly reduce or prevent prolonged interruption of the component mounting operation.

According to the tenth embodiment, the structure described above is provided. Accordingly, the shutters 23 can be closed except when the magazine 14 is conveyed, and thus it is possible to significantly reduce or prevent entry of foreign matter into the magazine holder 15.

The remaining advantageous effects of the tenth embodiment are similar to those of the first embodiment.

Modified Examples

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

For example, while the example in which the component mounting device is provided with two component supply devices has been shown in each of the aforementioned first to tenth embodiments, the present disclosure is not restricted to this. In the present disclosure, the component mounting device may be provided with one or three or more component supply devices.

While the example in which the magazine conveyance unit includes the first conveyance unit, the second conveyance unit, and the third conveyance unit has been shown in each of the aforementioned fifth and sixth embodiments, the present disclosure is not restricted to this. In the present disclosure, the magazine conveyance unit may include the first conveyance unit provided in the magazine supply unit and the second conveyance unit provided in the magazine holder. That is, the third conveyance unit may not be provided, the magazine ejection unit may include a slope, and the magazine may be moved along the slope.

While the example in which the transmission mechanism is configured to transmit the driving force of the second conveyance unit to the first conveyance unit has been shown in each of the aforementioned fifth and sixth embodiments, the present disclosure is not restricted to this. In the present disclosure, the transmission mechanism may be configured to transmit the driving force of the first conveyance unit to the second conveyance unit.

While the example in which the drive is provided in the second conveyance unit, and the first conveyance unit, the second conveyance unit, and the third conveyance unit are driven by the common drive has been shown in each of the aforementioned fifth and sixth embodiments, the present disclosure is not restricted to this. In the present disclosure, the drive may be provided in the first conveyance unit provided in the magazine supply unit or the third conveyance unit provided in the magazine ejection unit.

While the example in which the self-propelled trolley configured to convey the magazine to the magazine supply unit and convey the magazine from the magazine ejection unit is provided has been shown in the aforementioned eighth embodiment, the present disclosure is not restricted to this. In the present disclosure, the magazine supply unit and the magazine ejection unit may be self-propelled trolleys that are self-propellable.

While the example in which the component mounting device has one mounting lane has been shown in each of the aforementioned first to tenth embodiments, the present disclosure is not restricted to this. In the present disclosure, the component mounting device may have a plurality of mounting lanes.

While the example in which the component mounting device includes one head unit has been shown in each of the aforementioned first to tenth embodiments, the present disclosure is not restricted to this. In the present disclosure, the component mounting device may include a plurality of head units.

While the mounting operation control process is described, using the flow described in a manner driven by a flow in which processes are performed in order along a process flow for the convenience of illustration in the aforementioned first embodiment, the present disclosure is not restricted to this. In the present disclosure, the mounting operation control process may be performed in an event-driven manner in which processes are performed on an event basis. In this case, the process may be performed in a complete event-driven manner or in a combination of an event-driven manner and a manner driven by a flow.

What is claimed is:

1. A component supply device configured to supply a component to a component mounting device configured to mount the component on a substrate, the component supply device comprising:
   a pallet configured to allow a tray, on which the component is placed, to be arranged thereon;
   a magazine operable to hold a plurality of pallets including the pallet with the tray on which the component is placed;
   a magazine holder configured to allow the magazine to be arranged therein, the magazine holder being configured to allow the plurality of pallets to be conveyed from the magazine that has been arranged in the magazine holder to a component supply position in which the mounting device can pick up the component which is placed on the tray;
   a magazine supply unit provided at one side of the magazine holder, wherein the magazine supply unit is configured to receive and temporarily hold the magazine to be supplied to the magazine holder;
   a magazine ejection unit provided at a side of the magazine holder different than the one side, wherein the magazine ejection unit is configured to receive and temporarily hold the magazine ejected from the magazine holder; and
   a magazine conveyance unit including a conveyor between the magazine supply unit and the magazine ejection unit, wherein the magazine conveyance unit is configured to convey the magazine from the magazine supply unit to the magazine holder to supply the magazine to the magazine holder and convey the magazine from the magazine holder to the magazine ejection unit to eject the magazine from the magazine holder.

2. The component supply device according to claim 1, wherein the magazine conveyance unit is configured to convey the magazine from the magazine supply unit to the magazine holder based on the magazine, which has been arranged in the magazine holder, becoming replaceable when the magazine needs to be replaced.

3. The component supply device according to claim 2, wherein the magazine is configured to be moved from the magazine supply unit to the magazine holder along a substantially horizontal direction.

4. The component supply device according to claim 2, wherein the magazine supply unit, the magazine holder, and the magazine ejection unit are arranged along a direction parallel to a conveyance direction of the substrate of the component mounting device.

5. The component supply device according to claim 2, wherein
   the magazine ejection unit includes a slope formed at a boundary with the magazine holder; and
   the magazine is configured to be moved from the magazine holder to the magazine ejection unit down the slope.

6. The component supply device according to claim 2, wherein the magazine supply unit and the magazine ejection unit are arranged at positions lower than an installation height of a tape feeder, which is configured to supply a component held on a tape to the component mounting device, of the component mounting device.

7. The component supply device according to claim 2, wherein the magazine supply unit and the magazine ejection unit are configured to be attachable to and detachable from a device main body with the magazine holder being arranged therein.

8. The component supply device according to claim 1, wherein the magazine is configured to be moved from the magazine supply unit to the magazine holder along a substantially horizontal direction.

9. The component supply device according to claim 1, wherein the magazine supply unit, the magazine holder, and the magazine ejection unit are arranged along a direction parallel to a conveyance direction of the substrate of the component mounting device.

10. The component supply device according to claim 1, wherein
    the magazine ejection unit includes a slope formed at a boundary with the magazine holder; and
    the magazine is configured to be moved from the magazine holder to the magazine ejection unit down the slope.

11. The component supply device according to claim 1, wherein the magazine supply unit and the magazine ejection unit are arranged at positions lower than an installation height of a tape feeder, which is configured to supply a component held on a tape to the component mounting device, of the component mounting device.

12. The component supply device according to claim 1, wherein the magazine supply unit and the magazine ejection unit are configured to be attachable to and detachable from a device main body with the magazine holder being arranged therein.

13. The component supply device according to claim 12, wherein
    the magazine conveyance unit includes a first conveyance unit provided in the magazine supply unit, a second conveyance unit provided in the magazine holder, and a transmission mechanism configured to transmit a driving force of one of the first conveyance unit and the second conveyance unit to the other of the first conveyance unit and the second conveyance unit; and
    the first conveyance unit and the second conveyance unit are configured to be driven by a common drive.

14. The component supply device according to claim 13, wherein
    the magazine conveyance unit further includes a third conveyance unit provided in the magazine ejection unit; and
    the first conveyance unit, the second conveyance unit, and the third conveyance unit are configured to be driven by the common drive.

15. The component supply device according to claim 1, wherein the magazine supply unit and the magazine ejection unit are configured to be foldable with respect to a device main body with the magazine holder being arranged therein.

16. The component supply device according to claim 1, further comprising a magazine circulation unit configured to receive the magazine from the magazine ejection unit and move the magazine to the magazine supply unit.

17. The component supply device according to claim 1, further comprising a self-propelled trolley that is self-propellable, the self-propelled trolley being configured to convey the magazine to the magazine supply unit and convey the magazine from the magazine ejection unit.

18. The component supply device according to claim 1, wherein the magazine is suspended and carried in the magazine supply unit; and the magazine is suspended and carried out of the magazine ejection unit.

19. The component supply device according to claim 1, further comprising a shutter provided on each of a magazine supply unit side and a magazine ejection unit side of the magazine holder, the shutter being configured to be openable and closable.

20. A component mounting device comprising:
- a mounting head configured to mount a component on a substrate; and
- a component supply unit configured to supply the component to the mounting head;

wherein the component supply unit includes:
- a pallet configured to allow a tray, on which the component is placed, to be arranged thereon;
- a magazine operable to hold a plurality of pallets including the pallet with the tray on which the component is placed;
- a magazine holder configured to allow the magazine to be arranged therein, the magazine holder being configured to allow the plurality of pallets to be conveyed from the magazine that has been arranged in the magazine holder to a component supply position in which the mounting device can pick up the component which is placed on the tray;
- a magazine supply unit provided at one side of the magazine holder, wherein the magazine supply unit is configured to receive and temporarily hold the magazine to be supplied to the magazine holder;
- a magazine ejection unit provided at a side of the magazine holder different than the one side, wherein the magazine ejection unit is configured to receive and temporarily hold the magazine ejected from the magazine holder; and
- a magazine conveyance unit including a conveyor between the magazine supply unit and the magazine ejection unit, wherein the magazine conveyance unit is configured to convey the magazine from the magazine supply unit to the magazine holder to supply the magazine to the magazine holder and convey the magazine from the magazine holder to the magazine ejection unit to eject the magazine from the magazine holder.

\* \* \* \* \*